(12) United States Patent
Son et al.

(10) Patent No.: US 11,476,439 B2
(45) Date of Patent: Oct. 18, 2022

(54) DISPLAY DEVICE

(71) Applicant: SAMSUNG DISPLAY CO., LTD., Yongin-si (KR)

(72) Inventors: Jung Hyun Son, Seoul (KR); Yo Han Kim, Seoul (KR); Yoon Hyeung Cho, Yongin-si (KR); Jeong Su Kim, Asan-si (KR); Jong Jin Park, Cheonan-si (KR); Hae Gu Yeo, Cheonan-si (KR); Byoung Duk Lee, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 86 days.

(21) Appl. No.: 17/156,429

(22) Filed: Jan. 22, 2021

(65) Prior Publication Data

US 2021/0143358 A1 May 13, 2021

Related U.S. Application Data

(63) Continuation of application No. 16/714,552, filed on Dec. 13, 2019, now Pat. No. 10,903,446.

(30) Foreign Application Priority Data

Feb. 26, 2019 (KR) .................. 10-2019-0022361

(51) Int. Cl.
*H01L 51/52* (2006.01)
*H01L 27/32* (2006.01)

(52) U.S. Cl.
CPC ........ *H01L 51/524* (2013.01); *H01L 27/3211* (2013.01); *H01L 27/3246* (2013.01)

(58) Field of Classification Search
CPC . H01L 51/524; H01L 27/3211; H01L 27/3246
USPC ............................................. 257/40
See application file for complete search history.

(56) References Cited

U.S. PATENT DOCUMENTS 10,096,647 B2 * 10/2018 Takeya .................. H01L 33/42
10,665,641 B2    5/2020 Wang

FOREIGN PATENT DOCUMENTS

| KR | 10-2014-0086059 A | 7/2014 |
| KR | 10-2017-0062707 A | 6/2017 |
| KR | 10-2018-0047180 A | 5/2018 |
| KR | 10-2018-0058949 A | 6/2018 |
| KR | 10-2018-0065887 A | 6/2018 |

* cited by examiner

*Primary Examiner* — Tu-Tu V Ho
(74) *Attorney, Agent, or Firm* — Lewis Roca Rothgerber Christie LLP

(57) ABSTRACT

A display device is provided. The display device includes: a first base; light-emitting elements on the first base and in the pixels, respectively; a second base facing the first base; and a light-blocking/supporting member between the light-emitting elements and the second base and at a boundary of each of the pixels, wherein the light-blocking/supporting member includes a light-blocking portion and a plurality of supporting portions in the light-blocking portion.

20 Claims, 22 Drawing Sheets

DISPLAY DEVICE

CROSS-REFERENCE TO RELATED APPLICATION

This Continuation Application claims priority to and the benefit of U.S. patent application Ser. No. 16/714,552, filed Dec. 13, 2019, which claims priority to and the benefit of Korean Patent Application No. 10-2019-0022361 filed on Feb. 26, 2019, in the Korean Intellectual Property Office, the entire content of which is incorporated herein by reference.

BACKGROUND

1. Field

Embodiments of the present disclosure relate to a display device.

2. Description of the Related Art

Display devices have become more and more important as multimedia technology evolves. Accordingly, a variety of display devices such as liquid-crystal display devices (LCDs) and organic light-emitting diode display devices (OLEDs) are currently being developed.

Among such display devices, an organic light-emitting display device includes organic light-emitting elements which are self-luminous elements. An organic light-emitting element may include two opposing electrodes and an organic emissive layer interposed therebetween. Electrons and holes supplied from the two electrodes are recombined in the emissive layer to generate excitons, the generated excitons relax (e.g., transition) from the excited state to the ground state and accordingly light can be emitted.

Such an organic light-emitting display device does not require a separate light source, and thus, it consumes less power and can be made light and thin, as well as exhibiting high-quality characteristics such as wide viewing angle, high luminance and contrast, and fast response speed. Accordingly, organic light-emitting display devices are attracting attention as the next generation display device.

SUMMARY

Aspects of embodiments of the present disclosure provide a display device that can increase the color gamut by reducing the thickness of a filler and has improved reliability of the filling process.

It should be noted that objects of the present disclosure are not limited to the above-mentioned object; and other objects of the present disclosure will be apparent to those skilled in the art from the following description herein.

An embodiment of a display device includes a plurality of pixels. The display device includes a first base; light-emitting elements on the first base and in the pixels, respectively; a second base facing the first base; and a light-blocking/supporting member between the light-emitting elements and the second base and at a boundary of each of the pixels, wherein the light-blocking/supporting member includes a light-blocking portion and a plurality of supporting portions in the light-blocking portion.

An embodiment of a display device includes a plurality of pixels. The display device includes a base; light-emitting elements on the base and in the pixels, respectively; a bank layer surrounding the light-emitting elements and at a boundary of each of the pixels; a thin encapsulation layer covering the light-emitting elements and the bank layer; and a light-blocking/supporting member on the thin encapsulation layer and overlapping the bank layer, wherein the light-blocking/supporting member includes a light-blocking portion and a plurality of first supporting portions.

An embodiment of a display device includes a first substrate including a plurality of light-emitting elements; a second substrate opposed to the first substrate, wherein a first light-exiting area and a non-light-exiting area are defined on the second substrate; and a light-blocking/supporting member between the first substrate and the second substrate, wherein the second substrate includes a first wavelength conversion pattern in the first light-exiting area and converting a wavelength of light of a first color into a light of a second color, and wherein the filler overlaps the first wavelength conversion pattern, and the light-blocking/supporting member surrounds the filler and overlaps the non-light-exiting area.

According to an exemplary embodiment of the present disclosure, the color gamut of a display device can be increased by reducing the thickness of a filler and the reliability of the filling process can be improved.

It should be noted that effects of the present disclosure are not limited to those described above and other effects of the present disclosure will be apparent to those skilled in the art from the following descriptions.

BRIEF DESCRIPTION OF THE DRAWINGS

The above and other aspects and features of embodiments of the present disclosure will become more apparent by describing in more detail exemplary embodiments thereof with reference to the attached drawings, in which.

DETAILED DESCRIPTION

Figure 1:
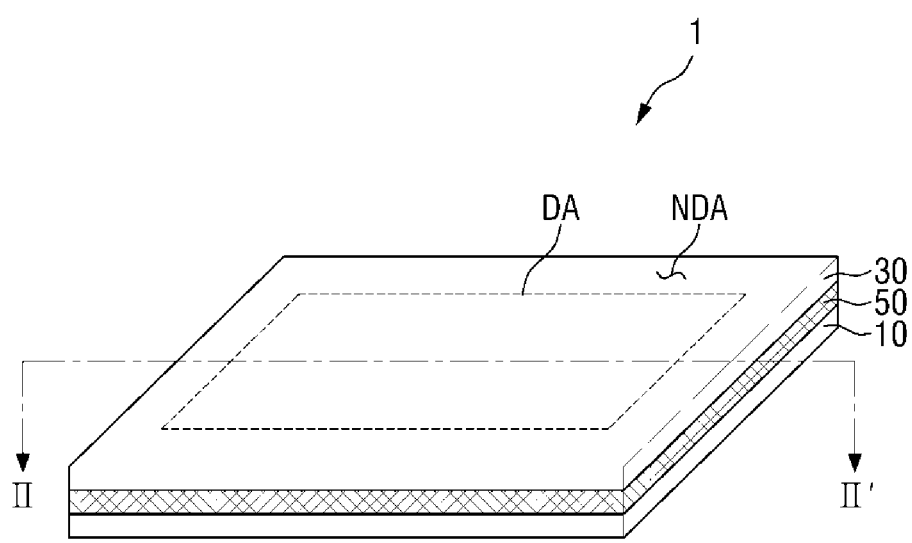
FIG. 1 is a perspective view of a display device according to an exemplary embodiment of the present disclosure.

Features of embodiments of the present disclosure, and methods of accomplishing the same, may be understood more readily by reference to the following detailed description of embodiments and the accompanying drawings. The subject matter of the present disclosure may, however, be embodied in many different forms and should not be construed as being limited to the embodiments set forth herein. Rather, these embodiments are provided so that this disclosure will be thorough and complete and will fully convey the concepts of the present disclosure to those skilled in the art, and the subject matter of the present disclosure will only be defined by the appended claims, and equivalents thereof. Like reference numerals refer to like elements throughout the specification.

It will be understood that when an element or layer is referred to as being "on," "connected to," or "coupled to" another element or layer, it can be directly on, connected or coupled to the other element or layer or intervening elements or layers may be present. In contrast, when an element is referred to as being "directly on," "directly connected to," or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the spirit and scope of the present disclosure.

Exemplary embodiments of the subject matter of the present disclosure are described herein with reference to plan and perspective illustrations that may be schematic illustrations of embodiments of the subject matter of the present disclosure. As such, variations from the shapes of the illustrations as a result, for example, of manufacturing techniques and/or tolerances, are to be expected. Therefore, the exemplary embodiments of the present disclosure are not limited to specific features but may include variations depending on the manufacturing processes. Therefore, the regions illustrated in the drawings have schematic attributes, and the shapes of the regions illustrated in the drawings are for illustrating specific shapes and are not for limiting the scope of the present disclosure.

The same or similar elements are herein designated by like reference numerals.

Hereinafter, exemplary embodiments of the present disclosure will be described with reference to the accompanying drawings.

Figure 2:
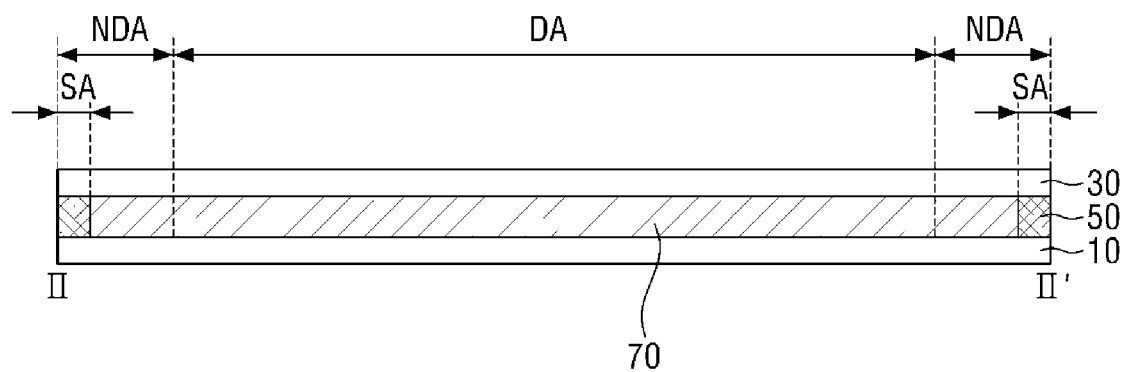
FIG. 2 is a cross-sectional view of a display device, taken along line II-II' of FIG. 1.
Figure 3:
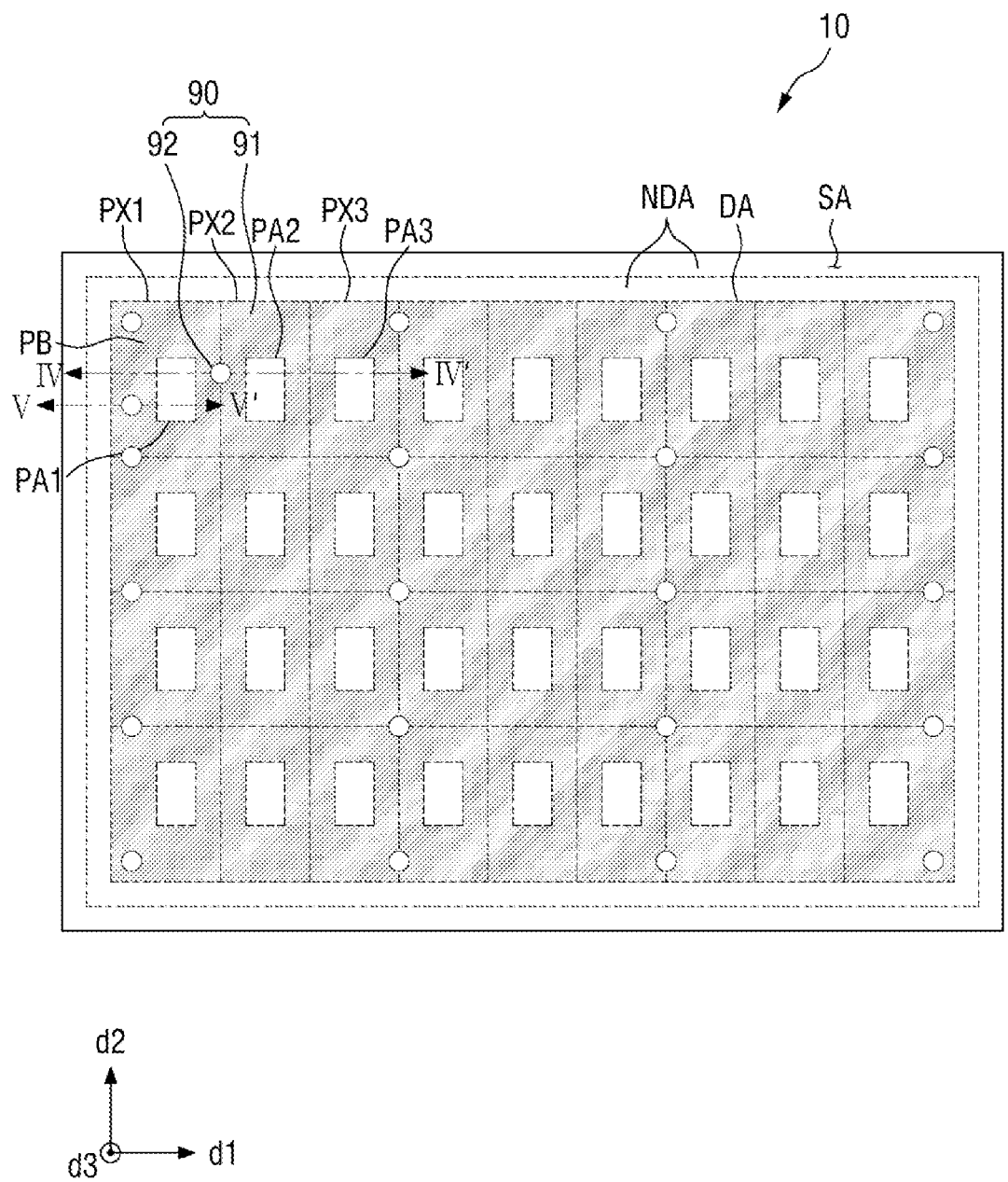
FIG. 3 is a plan view of the first substrate shown in FIGS. 1 and 2.

A display device 1 shown in FIGS. 1 to 3 may be employed in a variety of electronic devices including small-and-medium sized electronic devices such as a tablet PC, a smartphone, a vehicle navigation unit, a camera, a center information display (CID) installed in vehicles, a wrist-type electronic device, a personal digital assistant (PMP), a portable multimedia player (PMP) and a game machine, and medium-and-large electronic devices such as a television, an electric billboard, a monitor, a personal computer and a laptop computer. It should be understood that the above-listed electronic devices are merely illustrative and the display device 1 may be employed in a variety of other electronic devices without departing from the scope of the present disclosure.

In some exemplary embodiments, the display device 1 may have a rectangular shape when viewed from the top. The display device 1 may have two shorter sides extended in a direction, and two longer sides extended in another direction crossing the direction. Although the corners where the longer sides and the shorter sides of the display device 1 meet may form a right angle, this is merely illustrative. The display device 1 may have rounded corners. The shape of the display device 1 when viewed from the top is not limited to that shown in the drawings. The display device 1 may have a square shape, a circular shape, an elliptical shape or other shapes.

The display device 1 may include a display area DA where images are displayed, and a non-display area NDA where no image is displayed.

The display area DA may be in the center portion of display device. The display area DA may include a plurality of pixels. The plurality of pixels may include first pixels PX1 configured to emit light of a first color (e.g., red light having a peak wavelength in the range of approximately 610 to 650 nm), second pixels PX2 configured to emit light of a second color (e.g., green light having a peak wavelength in the range of approximately 510 to 550 nm), and third pixels PX3 configured to emit light of a third color (e.g., blue light having a peak wavelength in the range of approximately 430 to 470 nm). The first pixels PX1, the second pixels PX2 and the third pixels PX3 may be arranged repeatedly in a row direction and in a column direction. The first pixels PX1, the second pixels PX2, and the third pixels PX3 may be arranged in various suitable shapes such as stripes and pantiles.

Each of the first pixels PX1, the second pixels PX2, and the third pixels PX3 may include a first emitting area LA1, a second emitting area LA2, and a third emitting area LA3 and a non-emitting area LB. Each of the first emitting area LA1, the second emitting area LA2, and the third emitting area LA3 is defined as a region configured to emit light from an organic layer, and the non-emitting area LB is defined as a region where light is not emitted by the organic layer. The non-emitting area LB may be located to surround the first emitting area LA1, the second emitting area LA2, and the third emitting area LA3. The first emitting area LA1, the second emitting area LA2, and the third emitting area LA3 may be separated from the non-emitting area LB by a bank layer to be described herein below.

In addition, the first pixels PX1, the second pixels PX2, and the third pixels PX3 may include a first light-exiting area PA1, a second light-exiting area PA2, and a third light-exiting area PA3, respectively, and a non-light-exiting area PB. The first light-exiting area PA1, the second light-exiting area PA2, and the third light-exiting area PA2 are defined as areas where light exits to the outside through a display surface, while the non-light-exiting area PB is defined as an area where light does not exit to the outside through the display surface. The non-light-exiting area PB may be located to surround the first light-exiting area PA1, the second light-exiting area PA2, and the third light-exiting area PA2. The first light-exiting area PA1, the second light-exiting area PA2, and the third light-exiting area PA2 may be separated from the non-light-exiting area PB by a light-blocking member to be described later. Although the size of the first light-exiting area PA1, the second light-exiting area PA2, and the third light-exiting area PA2 may be larger than the size of the first emitting area LA1, the second emitting area LA2, and the third emitting area LA3, respectively, when viewed from the top, this is merely illustrative. The size of the first light-exiting area PA1, the second light-exiting area PA2, and the third light-exiting area PA2 may be equal to the size of the first emitting area LA1, the second emitting area LA2, and the third emitting area LA3, respectively.

The wavelength of the light emitted from each of the first pixels PX1, the second pixels PX2, and the third pixels PX3 may be adjusted not only by the light emitted from the first emitting area LA1, the second emitting area LA2, and the third emitting area LA3 but also by wavelength conversion patterns or color filters that overlap the first emitting area LA1, the second emitting area LA2, and the third emitting area LA3. For example, the first emitting area LA1 of the first pixel PX1, the second emitting area LA2 of the second pixel PX2 and the third emitting area LA3 of the third pixel PX3 all may be configured to emit light of the same (e.g., substantially the same) wavelength (e.g., blue light), and the blue light may be converted into different colors for different pixels by the wavelength conversion patterns and/or the color filters in the pixels.

The non-display area NDA may be outside of the display area DA and may surround the display area DA. The non-display area NDA may include no emitting area, or may include a dummy emitting area that has the same (e.g., substantially the same) structure as the emitting area but does not emit light, or may include an emitting area but light is blocked by a light-blocking member in a display direction.

The stack structure of the display device 1 is described herein in general terms. As shown in FIG. 2, the display device 1 may include a first substrate 10, a second substrate 30 opposed to the first substrate 10, a filler 70 interposed between the first substrate 10 and the second substrate 30, and a sealing member 50 coupling the first substrate 10 with the second substrate 30 at the edges thereof.

The first substrate 10 may include elements and circuits for displaying images, e.g., a pixel circuit such as a switching element, a bank layer defining the first emitting area LA1, the second emitting area LA2, and the third emitting area LA3 and the non-emitting area LB in the display area DA, and organic light-emitting elements. The first substrate 10 may be a display substrate.

The second substrate 30 is located above the first substrate 10 and faces the first substrate 10. The second substrate 30 may be, but is not limited to, a color conversion substrate including a color conversion pattern for converting the color of incident light.

A light-blocking/supporting member 90 may be between the first substrate 10 and the second substrate 30. The light-blocking/supporting member 90 may include a light-blocking portion 91 and a supporting portion 92 in the light-blocking portion 91.

The light-blocking portion 91 may be located along the boundary of each of the first pixels PX1, the second pixels PX2, and the third pixels PX3. Further, at least a part of the light-blocking portion 91 may overlap with the non-light-exiting area PB and the non-emitting area LB. The light-blocking portion 91 may include a light-absorbing material to block the light that leaks to the adjacent light-exiting area.

The supporting portion 92 may be at any suitable position in the light-blocking portion 91. The supporting portion 92 may be between the first substrate 10 and the second substrate 20 to generally maintain the gap between the first substrate 10 and the second substrate 30. The light-blocking/supporting member 90 will be described in more detail herein below.

The non-display area NDA may further include a sealing area SA. The sealing area SA may be continuously along the edge portions of the both longer sides and both shorter sides of the display device 1. The sealing member 50 may be between the first substrate 10 and the second substrate 300 in the sealing area SA. The sealing member 50 may surround the display area DA when viewed from the top. The first substrate 10 and the second substrate 30 may be coupled with each other by the sealing member 50. The sealing member 50 may be made of, but is not limited to, a material including an organic material such as an epoxy resin.

In FIGS. 1 and 2, the sealing area SA is formed along all the edges of the display device 1, for example, four edges when viewed from the top, and the sealing area SA is aligned with the side ends of the display device 1. It is, however, to be understood that the present disclosure is not limited thereto. For example, the sealing area SA may be formed on the inner side from at least one side end of the display device 1 to provide an area where an external device and/or a signal pad coupled to the external device, etc. are located. In addition, flowing of the sealing member 50 to the outer side of the display device 1 before the curing process of the sealing member 50 may be prevented or reduced by the sealing area SA.

The filler 70 may be located in the space between the first substrate 10 and the second substrate 30 surrounded by the sealing member 50. The filler 70 may be used to fill the space between the first substrate 10 and the second substrate 30. The filler 70 may be made of a material that transmits light. The filler 70 may include, but is not limited to, an organic material having a high refractive index such as a silicon-based organic material, an epoxy-based organic material and an epoxy-acrylic based organic material. In some exemplary embodiments, the filler 70 may include a silicone rubber.

Hereinafter, the structure of the display device 1 will be described in more detail with reference to FIGS. 4 to 9.

Figure 4:
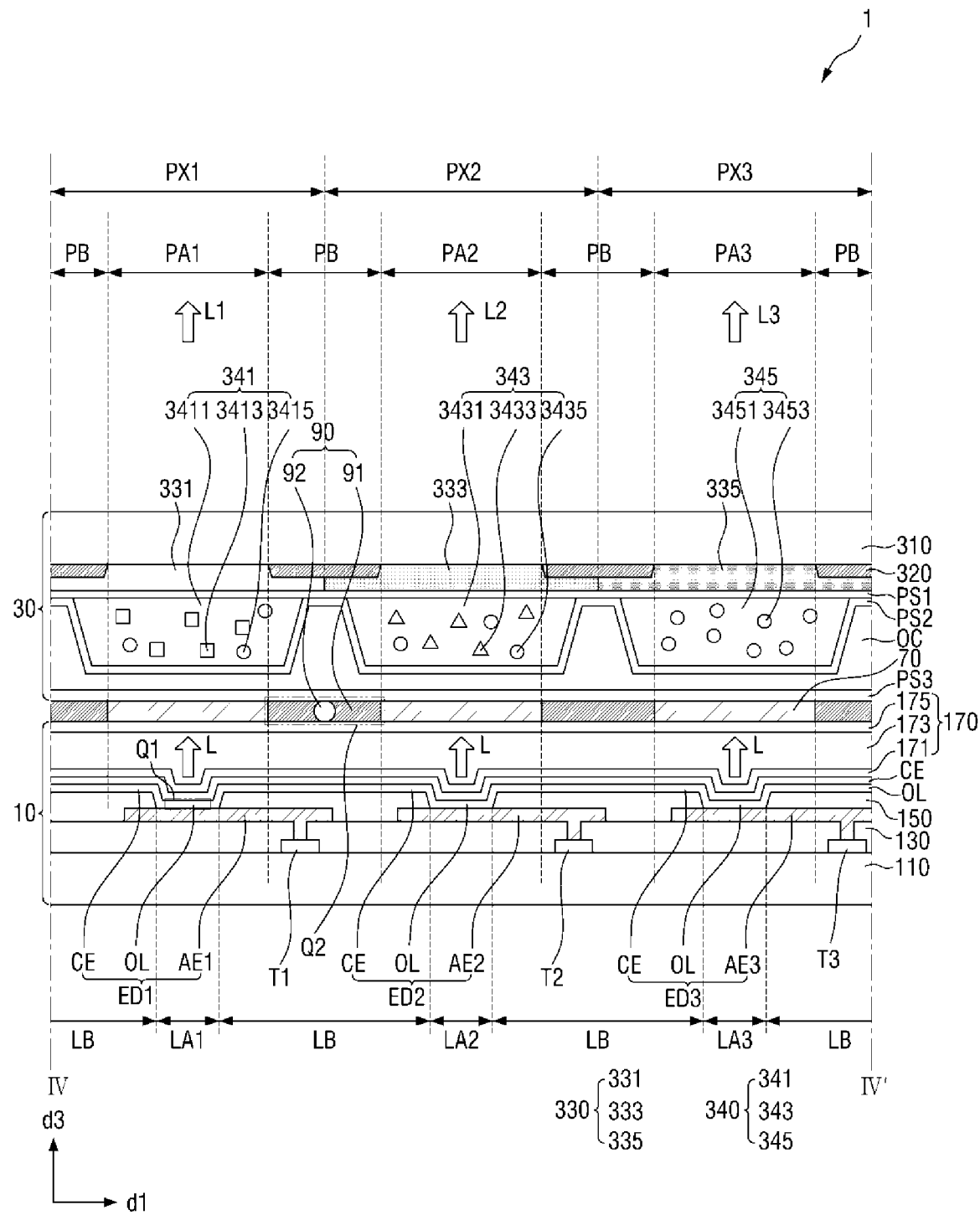
FIG. 4 is a cross-sectional view of a display device, taken along line IV-IV' of FIG. 3.
Figure 5:
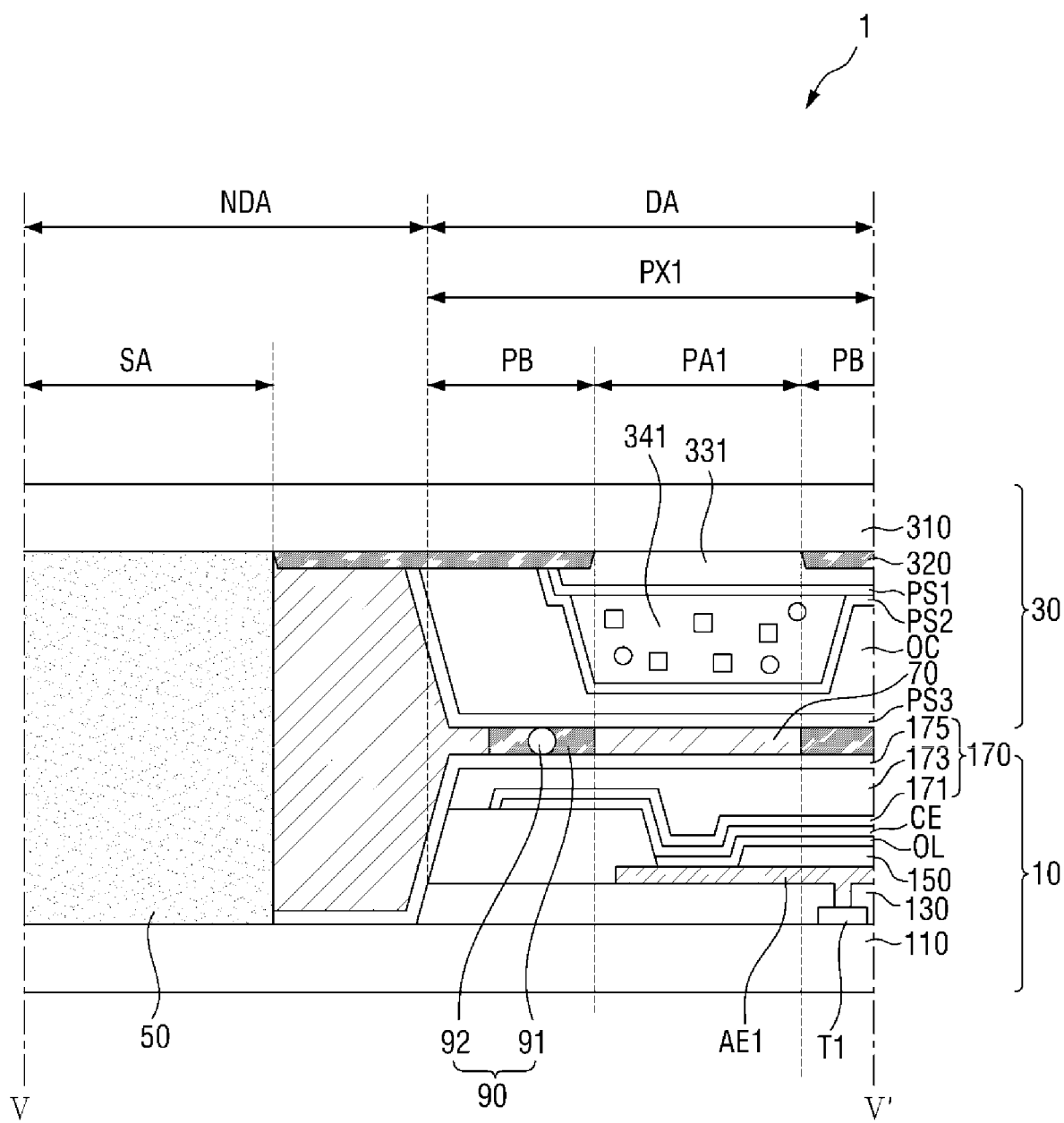
FIG. 5 is a cross-sectional view of a display device, taken along line V-V' of FIG. 3.
Figure 6:
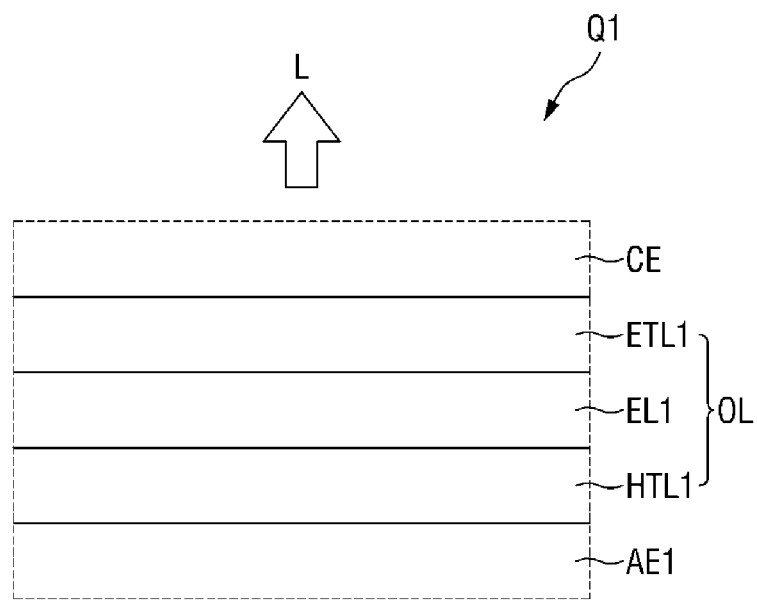
FIG. 6 is an enlarged cross-sectional view of portion Q1 of FIG. 4.
Figure 7:
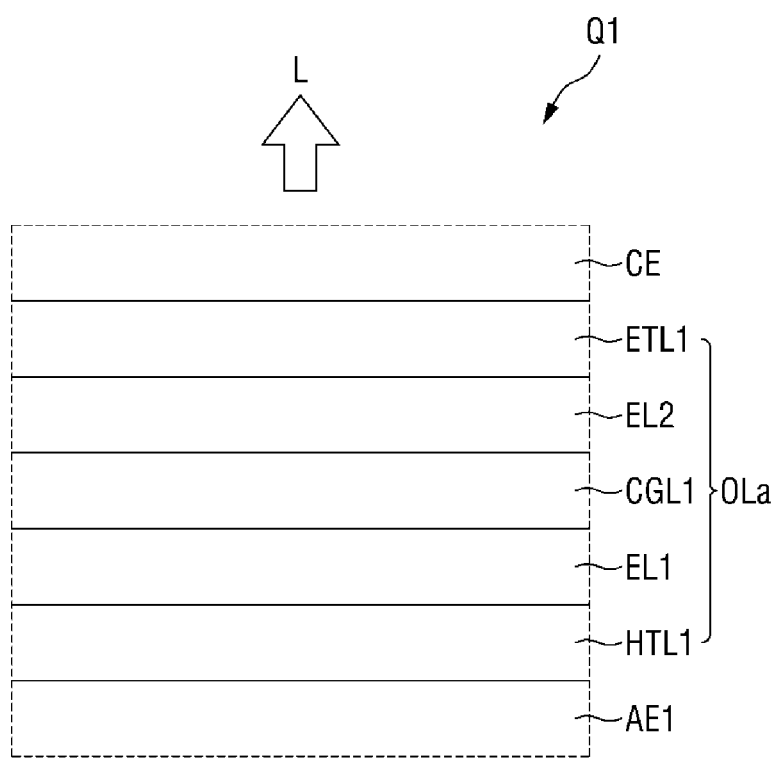
FIG. 7 is a cross-sectional view showing a modification of the structure shown in FIG. 6.
Figure 8:
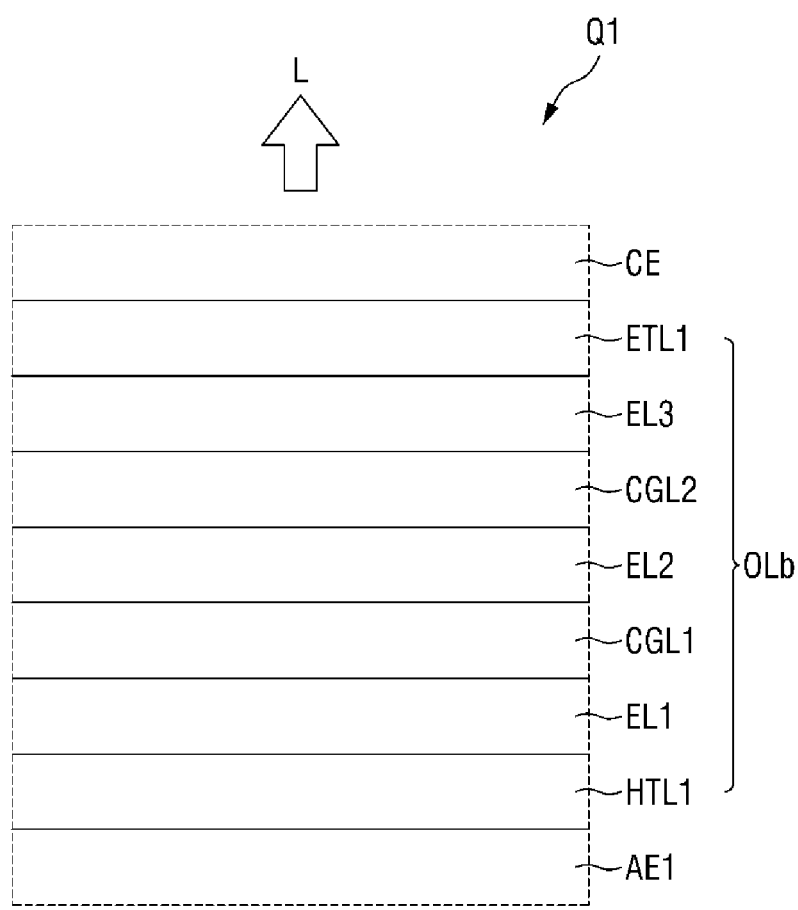
FIG. 8 is a cross-sectional view showing another modification of the structure shown in FIG. 6.
Figure 9:
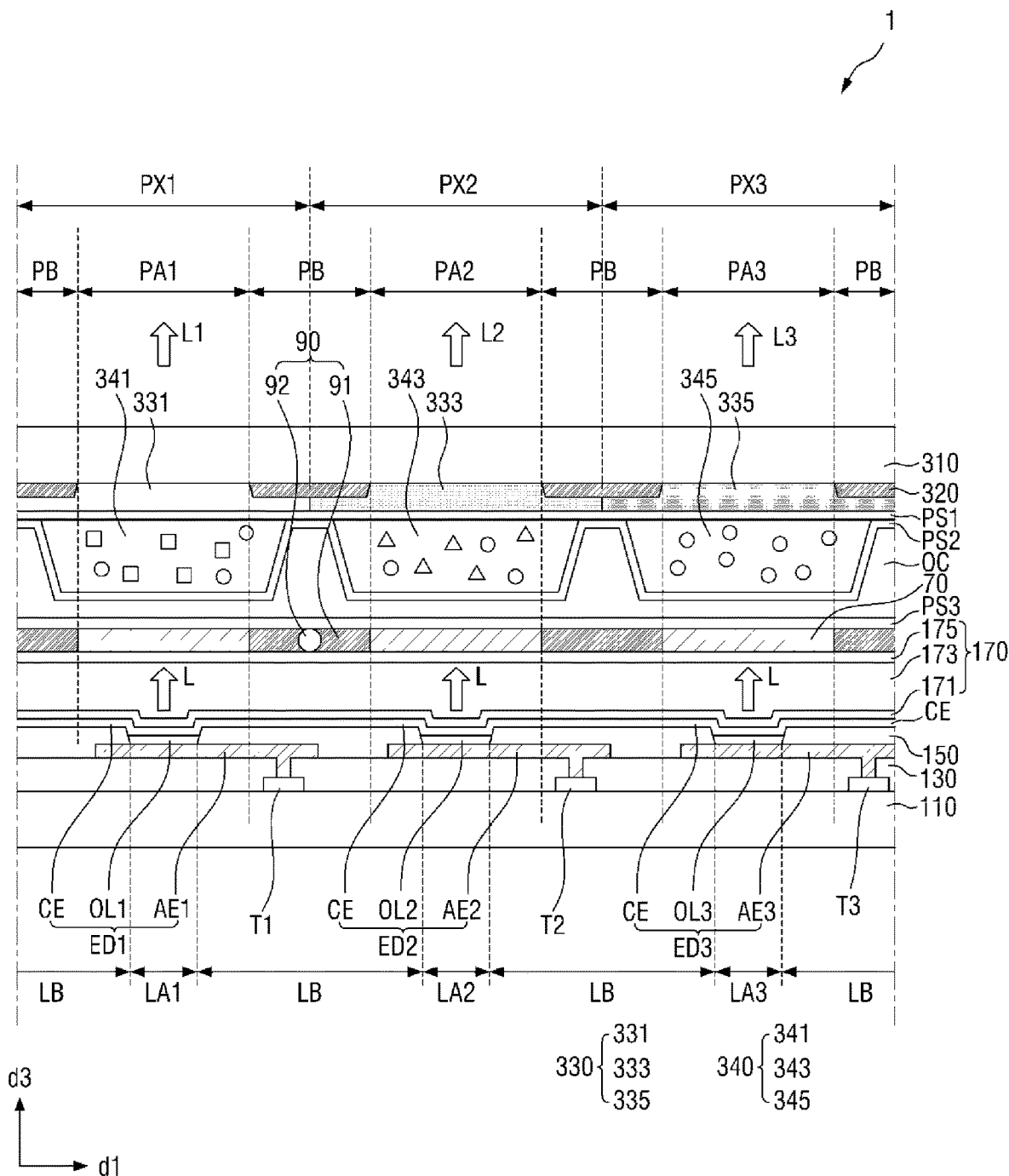
FIG. 9 is a cross-sectional view showing a modification of the structure shown in FIG. 4.

FIG. 4 is a cross-sectional view of the display device according to the exemplary embodiment of the present disclosure, taken along line IV-IV' of FIG. 3. FIG. 5 is a cross-sectional view of a display device according to an exemplary embodiment of the present disclosure, taken along line V-V' of FIG. 3. FIG. 6 is an enlarged cross-sectional view of portion Q1 of FIG. 4. FIG. 7 is a cross-sectional view showing a modification of the structure shown in FIG. 6. FIG. 8 is a cross-sectional view showing another modification of the structure shown in FIG. 6. FIG. 9 is a cross-sectional view showing a modification of the structure shown in FIG. 4.

Initially, referring to FIG. 4, the display device 1 includes the first substrate 10 and the second substrate 30 as described above. The display device 1 may include the sealing member 50 between the first substrate 10 and the second substrate 30 to couple them, and the filler 70 in the space surrounded by the first substrate 10, the second substrate 30 and the sealing member 50.

Hereinafter, the first substrate 10 will be described in more detail. The first substrate 10 may include a first base 110, a first switching element T1, a second switching element T2, and a third switching element T3, an insulating layer 130, a bank layer 150, a first organic light-emitting element ED1, a second organic light-emitting element ED2, and a third organic light-emitting element ED3, and a thin encapsulation layer 170.

The first base 110 may be made of a light-transmitting material. The first base 110 may be a glass substrate or a plastic substrate.

At least one a first switching element T1, a second switching element T2, and a third switching element T3 may be in each of the first pixels PX1, the second pixels PX2, and the third pixels PX3 on the first base 110. In some embodiments, a plurality of signal lines (for example, gate lines, data lines, power lines, etc.) for transmitting signals to the switching elements may be further on the first base 110.

The insulating layer 130 may be over the first switching element T1, the second switching element T2, and the third switching element T3. The insulating layer 130 may be formed of an organic layer. For example, the insulating layer 130 may include an acrylic resin, an epoxy resin, an imide resin, an ester resin, etc.

A first pixel electrode AE1, a second pixel electrode AE2, and a third pixel electrode AE3 may be on the insulating layer 130 in the first pixels PX1, the second pixels PX2, and the third pixels PX3, respectively. The first pixel electrode AE1, the second pixel electrode AE2, and the third pixel electrode AE3 may be located within the first emitting area LA1, the second emitting area LA2, and the third emitting area LA3, respectively, and at least a part thereof may be extended to the non-emitting area LB. The first pixel electrode AE1, the second pixel electrode AE2, and the third pixel electrode AE3 may be coupled to the first switching element T1, the second switching element T2, and the third switching element T3, respectively, through via-holes penetrating through the insulating layer 130.

In an exemplary embodiment, each of the first pixel electrode AE1, the second pixel electrode AE2, and the third pixel electrode AE3 may be the anode electrode of the respective organic light-emitting element. The first pixel electrode AE1, the second pixel electrode AE2, and the third pixel electrode AE3 may include a material having a high work function for easy injection of holes, such as indium-tin-oxide (ITO), indium-zinc-oxide (IZO), zinc oxide (ZnO) and indium oxide ($In_2O_3$). When the display device 1 is a top-emission display device, the first pixel electrode AE1, the second pixel electrode AE2, and the third pixel electrode AE3 may further include a reflective metal layer. When the reflective metal layer may include, for example, silver (Ag), magnesium (Mg), aluminum (Al), platinum (Pt), lead (Pb), gold (Au), nickel (Ni), neodymium (Nd), iridium (Ir), chrome (Cr), lithium (Li), calcium (Ca) or a mixture thereof. In some exemplary embodiments, the first pixel electrode AE1, the second pixel electrode AE2, and the third pixel electrode AE3 may have a two-layer structure of ITO/Ag, Ag/ITO, ITO/Mg and ITO/MgF, or a multi-layer structure of ITO/Ag/ITO.

The bank layer 150 may be over the first pixel electrode AE1, the second pixel electrode AE2, and the third pixel electrode AE3. The bank layer 150 is along the boundaries of the pixels PX1, PX2, and PX3. The bank layer 150 may be formed in a lattice shape and may include openings that partially expose the first pixel electrode AE1, the second pixel electrode AE2, and the third pixel electrode AE3. As described above, the light-first emitting area LA1, the second emitting area LA2, and the third emitting area LA3 may be separated from the non-emitting area LB by the bank layer 150. The portions of the first pixel electrode AE1, the second pixel electrode AE2, and the third pixel electrode AE3 which are not covered by the bank layer 150 but are exposed may be the first emitting area LA1, the second emitting area LA2, and the third emitting area LA3, whereas the other portion covered by the bank layer 150 may be the non-emitting area. The sizes of the areas exposed via the openings may be different from one another. In other words, the areas of the first emitting area LA1, the second emitting area LA2, and the third emitting area LA3 may be different from one another. It is, however, to be understood that the present disclosure is not limited thereto. The areas of the first emitting area LA1, the second emitting area LA2, and the third emitting area LA3 may be equal to one another.

In some exemplary embodiments, the bank layer 150 may include an organic insulating material such as polyacrylate resin, epoxy resin, phenolic resin, polyamide resin, polyimide resin, unsaturated polyesters resin, poly phenylene ether resin, poly phenylene sulfide resin, and benzocyclobutene (BCB).

An organic layer OL may be on the portions of the first pixel electrode AE1, the second pixel electrode AE2, and the third pixel electrode AE3 exposed via the openings of the bank layer 150. The organic layer OL will be described herein in more detail with reference to FIGS. 6 and 8.

Although FIGS. 6 to 8 show the stack structure of the organic layer OL of the first pixel PX1 only among the first pixels PX1, the second pixels PX2, and the third pixels PX3, it is to be understood that the organic layer OL of the other pixels may all have the same (e.g., substantially the same) stacking structure.

Referring to FIG. 6, according to an exemplary embodiment of the present disclosure, the organic layer OL may include a first hole transport layer HTL1 on the first pixel electrode AE1, a first emissive layer EL11 on the first hole transport layer HTL1, and a first electron transport layer ETL1 on the first emissive layer EL11. According to the exemplary embodiment of the present disclosure, the organic layer OL may include only a single emissive layer, for example, the first emissive layer EL11 as the emissive layer. The first emissive layer EL11 may be a blue emissive layer. It is, however, to be understood that the stack structure of the organic layer OL is not limited to the structure of FIG. 6 and may be modified as shown in FIG. 7 or FIG. 8.

Referring to FIG. 7, an organic layer OLa may further include a first charge generation layer CGL11 on the first emissive layer EL11, and a second emissive layer EL12 on the first charge generation layer CGL11. The first charge transport layer ETL1 may be on the second emissive layer EL12.

The first charge generation layer CGL11 may serve to inject charges into the adjacent emissive layers. The first charge generation layer CGL11 may serve to control the charge balance between the first emissive layer EL11 and the second emissive layer EL12. In some exemplary embodiments, the first charge generation layer CGL11 may include an n-type charge generation layer and a p-type charge generation layer. The p-type charge generation layer may be on the n-type charge generation layer.

The second emissive layer EL12 may be configured to emit blue light like the first emissive layer EL11. It is, however, to be understood that the present disclosure is not limited thereto. The second emissive layer EL12 may be configured to emit blue light having either the same peak wavelength as or a different peak wavelength from that of the first emissive layer EL11. In another embodiment, the first emissive layer EL11 and the second emissive layer EL12 may be configured to emit light of different colors. For example, the first emissive layer EL11 may be configured to emit blue light whereas the second emissive layer EL12 may be configured to emit green light.

The organic layer OLa having the above-described structure includes two emissive layers, so that the light extraction efficiency and lifetime can be improved compared with the structure of FIG. 6.

FIG. 8 illustrates that an organic layer OLb may include a first emissive layer EL11, a second emissive layer EL12, and a third emissive layer EL13 and two charge generation layers CGL11 and CGL12 interposed therebetween. As shown in FIG. 8, the organic layer OLb may further include a first charge generation layer CGL11 on the first emissive layer EL11, a second emissive layer CGL11 on the first charge generation layer CGL11, a second charge generation layer CGL12 on the second emissive layer EL12, and the third emissive layer EL13 on the second charge generation layer CGL12. The first charge transport layer ETL1 may be on the third emissive layer EL13.

The third emissive layer EL13 may be configured to emit blue light like the first emissive layer EL11 and the second emissive layer EL12. In an exemplary embodiment, each of the first emissive layer EL11, the second emissive layer EL12 and the third emissive layer EL13 may be configured to emit blue light of the same wavelength peak or a different wavelength peak. In another exemplary embodiment, the first emissive layer EU 1, the second emissive layer EL12 and the third emissive layer EL13 may be configured to emit light of different colors. For example, each of the emissive layers may be configured to emit blue or green light or the emissive layers may be configured to emit red, green, and blue light, respectively, to emit white light as a whole.

Referring again to FIG. 4, the organic layers OL on the first pixel electrode AE1, the second pixel electrode AE2, and the third pixel electrode AE3 may be coupled to one another. Even if the organic layers OL on the first pixel electrode AE1, the second pixel electrode AE2, and the third pixel electrode AE3 are coupled to one another, only the parts of the organic layers that are in contact with the first pixel electrode AE1, the second pixel electrode AE2, and the third pixel electrode AE3 can be configured to emit light. If the organic layers OL are formed across the pixels as a common layer, they can be formed concurrently (e.g., simultaneously), which is beneficial in terms of process efficiency.

FIG. 9 illustrates an example where a first organic layer OL1, a second organic layer OL2, and a third organic layer OL3 are separated from one another and in the respective pixels, unlike the exemplary embodiment of FIG. 4. Referring to FIG. 9, the first organic layer OL1 on the first pixel electrode AE1, the second organic layer OL2 on the second pixel electrode AE2 and the third organic layer OL3 on the third pixel electrode AE3 are separated from one another. For example, the first organic layer OL1, the second organic layer OL2, and the third organic layer OL3 may be on the first pixel electrode AE1, the second pixel electrode AE2, and the third pixel electrode AE3, respectively, exposed via the openings of the bank layer 150, such that they may be separated from one another by the bank layer 150. When the first organic layer OL1, the second organic layer OL2, and the third organic layer OL3 are separated from one another and in the respective first pixels PX1, second pixels PX2, and third pixels PX3, it is possible to prevent or reduce emission of light from an undesired pixel by a leakage current.

In some exemplary embodiments, some of the stack layers of the first organic layer OL1, the second organic layer OL2, and the third organic layer OL3 may be separate from one another and in the respective pixels as shown in FIG. 9, while the other thereof may be formed across the pixels as shown in FIG. 4. For example, the emissive layer of each of the organic layers may be separated from pixel to pixel while the hole transport layer and/or the electron transport layer may be formed as a common layer.

Referring back to FIG. 4, a common electrode CE is on the organic layers OL. The common electrode CE may be on the whole surface across the first pixels PX1, the second pixels PX2, and the third pixels PX3.

When each of the first pixel electrode AE1, the second pixel electrode AE2, and the third pixel electrode AE3 is the anode electrode of the respective organic light-emitting element, the common electrode CE is the cathode electrode of the organic light-emitting element. The common electrode CE may include a material having a low work function to allow easy for injection of electrons, for example, Li, Ca, LiF/Ca, LiF/Al, Al, Mg, Ag, Pt, Pd, Ni, Au, Nd, Ir, Cr, BaF, Ba, etc. or a compound or mixture thereof (e.g., a mixture of Ag and Mg).

When the display device 1 is a top-emission display device, the common electrode CE may be transparent or transflective. When the common electrode CE is formed of one of the above-described materials having a low work function with a thickness in the range of several tens to several hundreds of angstroms (Å), it may be transparent or transflective. When the common electrode CE includes a thin metal film having a low work function, it may further include a transparent conductive material layer on the thin metal film such as tungsten oxide (WxOx), titanium oxide ($TiO_2$), indium tin oxide (ITO), indium zinc oxide (IZO), zinc oxide (ZnO), indium tin zinc oxide (ITZO) and magnesium oxide (MgO), in order to reduce the resistance and to achieve the transmittance.

The first pixel electrode AE1, the organic layer OL and the common electrode CE may form a first organic light-emitting element device ED1. The second pixel electrode AE2, the organic layer OL and the common electrode CE may form a second organic light-emitting element ED2. The third pixel electrode AE3, the organic layer OL and the common electrode CE may form a third organic light-emitting element ED3.

The thin encapsulation layer 170 is on the common electrode CE. In order to prevent or reduce permeation of impurities or moisture from the outside, the thin encapsulation layer 170 may be above the first organic light-emitting element ED1, the second organic light-emitting element ED2, and the third organic light-emitting element ED3 to seal the first substrate 10.

The thin encapsulation layer 170 may be on the whole surface across the first pixels PX1, the second pixels PX2, and the third pixels PX3. Further, the thin encapsulation layer 170 may be extended to a part of the non-display area NDA as shown in FIG. 5. In some embodiments, a capping layer may be further between the thin encapsulation layer 170 and the common electrode CE to cover the common electrode CE, in which case the thin encapsulation layer 170 may directly cover the capping layer.

The thin encapsulation layer 170 may cover the first organic light-emitting element ED1, the second organic light-emitting element ED2, and the third organic light-emitting element ED3 including the common electrode CE thereunder. Each of the first organic light-emitting element ED1, the second organic light-emitting element ED2, and the third organic light-emitting element ED3 may be surrounded and sealed by the first base 110 and the thin encapsulation layer 170.

The thin encapsulation layer 170 may include a first inorganic encapsulation layer 171, an organic encapsulation layer 173 and a second inorganic encapsulation layer 175 sequentially stacked on the common electrode CE.

Each of the first inorganic encapsulation layer 171 and the second inorganic encapsulation layer 175 may be made of silicon nitride, aluminum nitride, zirconium nitride, titanium nitride, hafnium nitride, tantalum nitride, silicon oxide, aluminum oxide, titanium oxide, tin oxide, cerium oxide, silicon oxynitride (SiON), lithium fluoride, and the like.

The organic encapsulation layer 173 may be made of acrylic resin, methacrylic resin, polyisoprene, vinyl resin, epoxy resin, urethane resin, cellulose resin and perylene resin.

The first inorganic encapsulation layer 171 may be on a surface of the common electrode CE. As described above, the common electrode CE may include a concavo-convex shape on the surface conformally reflecting the level differences thereunder. The first inorganic encapsulation layer 171 is made of an inorganic material and can conformally reflect at least a part of the concavo-convex shape of the common electrode CE thereunder. Accordingly, the first inorganic encapsulation layer 171 may have a concavo-convex shape, like the common electrode CE.

The organic encapsulation layer 173 may be on a surface of the first inorganic encapsulation layer 171. The organic encapsulation layer 173 may be used to fill the concavo-convex shape of the surface of the first inorganic encapsulation layer 171 to reduce the level differences thereunder or provide a flat surface over it The second inorganic encapsulation layer 175 may be on a surface of the organic encapsulation layer 173.

The first inorganic encapsulation layer 171 may be in contact with the second inorganic encapsulation layer 175 at the edge portion. For example, when the shapes of the first inorganic encapsulation layer 171 and the second inorganic encapsulation layer 175 are larger than that of the organic encapsulation layer 173 when viewed from the top, their end portions may be in contact with each other. Accordingly, the organic encapsulation layer 173 can be completely sealed by the first inorganic encapsulation layer 171 and the second inorganic encapsulation layer 175. Although the second inorganic encapsulation layer 175 is extended further outward than the first inorganic encapsulation layer 171 in the example shown in FIG. 5, this is merely illustrative. The first inorganic encapsulation layer 171 may be extended further outward or the first inorganic encapsulation layer 171 and the second inorganic encapsulation layer 175 may be formed to have the same (e.g., substantially the same) size when viewed from the top and their end portions may be aligned with each other.

It is to be noted that the structure of the thin encapsulation layer 170 is not limited to the above example. The stack structure of the thin encapsulation layer 170 may be altered in a variety of ways.

Hereinafter, the second substrate 30 will be described in more detail. The second substrate 30 may include a second base 310, a light-blocking member 320, color filters 330, light modulation patterns 340, a planarization layer OC, and capping layers PS1, PS2 and PS3.

The first light-exiting area PA1, the second light-exiting area PA2, and the third light-exiting area PA2 and the non-light-exiting area PB may be defined on the second substrate 30. The first light-exiting area PA1, the second light-exiting area PA2, and the third light-exiting area PA2 are defined as areas where light exits to the outside, while the non-light-exiting area PB is defined as an area where light is blocked and does not exit to the outside. The non-light-exiting area PB may be located to surround the first light-exiting area PA1, the second light-exiting area PA2, and the third light-exiting area PA2. The first light-exiting area PA1, the second light-exiting area PA2, and the third light-exiting area PA2 may include the above-described first emitting area LA1, the second emitting area LA2, and the third emitting area LA3, respectively, and may include at least a part of the non-emitting area LB. The non-light-exiting area PB may be in the non-emitting area LB. For example, the area of the first light-exiting area PA1, the third light-exiting area PA2, and the third light-exiting area PA3 may be greater than the area of the first emitting area LA1, the second emitting area LA2, and the third emitting area LA3, and the area of the non-light-exiting area PB may be smaller than the area of the non-emitting area LB. It is, however, to be understood that the present disclosure is not limited thereto.

Although the areas of the first light-exiting area PA1, the second light-exiting area PA2, and the third light-exiting area PA3 may be different from one another, the present disclosure is not limited thereto. The area of the first light-exiting area PA1, the second light-exiting area PA2, and the third light-exiting area PA3 may be equal to one another.

The second base 310 may be made of a light-transmitting material. The second base 310 may be a glass substrate or a plastic substrate.

The light-blocking member 320 may be on the surface of the second base 310 (e.g., the second base substrate) that faces the first base 110 (the lower side of FIG. 4). The light-blocking member 320 may be along the boundary of each of the first pixels PX1, the second pixels PX2, and the third pixels PX3 and may block transmission of light. For example, the light-blocking member 320 may be formed in a lattice shape when viewed from the top and may prevent or reduce color mixing, which occurs when light crosses over the adjacent first light-exiting area PA1, the second light-exiting area PA2, and the third light-exiting area PA2. The first light-exiting area PA1, the second light-exiting area PA2, and the third light-exiting area PA2 may be separated from the non-light-exiting area PB by the light-blocking member 320. For example, the portions of the second base 310 that does not overlap with the light-blocking member 320 becomes the first light-exiting area PA1, the second light-exiting area PA2, and the third light-exiting area PA2, and the portion of the second base 310 that overlaps with the light-blocking member 320 becomes the non-light-exiting area PB.

The light-blocking member 320 may be formed of an organic material containing at least one of graphite, carbon black, black pigment and black dye, or may be formed of a metal material including chromium (Cr). It is, however, to be noted that the material of the light-blocking member 320 is not particularly limited herein as long as it can block light transmission and absorb the light.

A first color filter 331, a second color filter 333, and a third color filter 335 may be on the second base 310 and the light-blocking member 320. The first color filter 331 may overlap with the first light-exiting area PA1, the second color filter 333 may overlap with the second light-exiting area PA2, and the third color filter 335 may overlap with the third light-exiting area PA3.

Each of the first color filter 331, the second color filter 333, and the third color filter 335 may be an absorptive filter that can selectively transmit light of a set or particular color and absorb light of other colors to block the transmission of the light. For example, the first color filter 331 may transmit light of a first color and absorb light of a second color and light of a third color to block them. As described above, the light of the first color may be red light, the light of the second color may be green light, and the light of the third color may be blue light. For example, the first color filter 331 may be a red light transmitting filter that transmits red light and blocks and absorbs green light and blue light, and may include a red colorant.

For example, the second color filter 333 may transmit light of the second color and absorb light of the first color and light of the third color to block them. In some embodiments, the second color filter 333 may be a green light transmitting filter that transmits green light and blocks and absorbs red light and blue light, and may include a green colorant.

The third color filter 335 may transmit light of the third color and absorb light of the first color and light of the second color to block them. For example, the third color filter 335 may be a blue light transmitting filter that transmits blue light and blocks and absorbs red light and green light, and may include a blue colorant.

Besides, each of the first color filter 331, the second color filter 333, and the third color filter 335 may absorb at least a part of light incident from the outside. For example, because the first color filter 331 functions as a red light transmitting filter, it can block at least a part of the external light excluding red light. In addition, because the second color filter 333 functions as a green light transmitting filter, it can block at least a part of the external light excluding green light. In addition, because the third color filter 335 functions as a blue light transmitting filter, it can block at least a part of the external light excluding blue light. In this manner, the first color filter 331, the second color filter 333, and the third color filter 335 can suppress or reduce the reflection by the external light.

In some exemplary embodiments, the boundaries among the first color filter 331, the second color filter 333, and the third color filter 335 may be located in the non-light-exiting area PB. The light-blocking member 320 may be between the boundaries among the first color filter 331, the second color filter 333, and the third color filter 335 and the second base 310.

The first capping layer PS1 may be on the first color filter 331, the second color filter 333, and the third color filter 335. The first capping layer PS1 can prevent or reduce damage or contamination of the first color filter 331, the second color filter 333, and the third color filter 335 from impurities such as moisture and air that permeate from the outside. In addition, the first capping layer PS1 can prevent or reduce diffusion of the colorant included in each of the first color filter 331, the second color filter 333, and the third color filter 335 into other elements.

In some exemplary embodiments, the first capping layer PS1 may be made of an inorganic material. For example, the first capping layer PS1 may be made of a material including silicon nitride, aluminum nitride, zirconium nitride, titanium nitride, hafnium nitride, tantalum nitride, silicon oxide, aluminum oxide, titanium oxide, tin oxide, cerium oxide, silicon oxynitride, etc.

The first capping layer PS1 may be a single layer containing at least one of the above-described inorganic materials or may be formed of multiple layers containing different inorganic materials.

The light modulation pattern 340 may be on the first capping layer PS1. The light modulation patterns 340 may include a first wavelength conversion pattern 341, a second wavelength conversion pattern 343, and a light transmission pattern 345.

The first wavelength conversion pattern 341 may be in the first light-exiting area PA1 and not in the second light-exiting area PA2 and the third light-exiting area PA3. The first wavelength conversion pattern 341 may convert the peak wavelength of the incident light into light of another peak wavelength so that the light exits. For example, the first wavelength conversion pattern 341 may convert blue light into red light in the range of approximately 610 to 650 nm.

The first wavelength conversion pattern 341 may include a first base resin 3411 and a first wavelength-converting material 3413 dispersed in the first base resin 3411, and may further include first scatterers 3415 dispersed in the first base resin 3411.

The material of the first base resins 3411 is not particularly limited as long as it has a high light transmittance and the first wavelength-converting material 3413 and the first scatters 3415 can be dispersed well therein. For example, the first base resin 3411 may include an organic material such as an epoxy resin, an acrylic resin, a cardo resin, or an imide resin.

The first wavelength-converting material 3413 may convert the peak wavelength of the incident light into light of another peak wavelength. Examples of the first wavelength-converting material 3413 may include quantum dots, quantum rods or phosphors. Quantum dots may be particulate matter configured to emit light of a color as electrons transition from the conduction band to the valence band.

The quantum dots may be semiconductor nanocrystalline material. The quantum dots have a set or specific band gap depending on their compositions and size, and can absorb light and emit light having an intrinsic wavelength. Examples of the semiconductor nanocrystals of the quantum dots may include Group IV nanocrystals, Groups II-VI compound nanocrystals, Groups III-V compound nanocrystals, Groups IV-VI nanocrystals, or combinations thereof.

For example, examples of the Group IV nanocrystals may include, but is not limited to, binary compounds such as silicon (Si), germanium (Ge), silicon carbide (SiC) and silicon-germanium (SiGe).

In addition, examples of the Group II-VI compound nanocrystals may include, but is not limited to, binary compounds such as CdSe, CdTe, ZnS, ZnSe, ZnTe, ZnO, HgS, HgSe, HgTe, MgSe, MgS and a mixture thereof; ternary compounds such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS and a mixture thereof; or quaternary compounds such as HgZnTeS, CdZnSeS, CdZnSeTe, CdZnSTe, CdHgSeS, CdHgSeTe, CdHgSTe, HgZnSeS, HgZnSeTe, HgZnSTe and a mixture thereof.

Examples of the Group III-V compound nanocrystals may include, but is not limited to, binary compounds such as GaN, GaP, GaAs, GaSb, AlN, AlP, AlAs, AlSb, InN, InP, InAs, InSb and a mixture thereof; ternary compounds such as GaNP, GaNAs, GaNSb, GaPAs, GaPSb, AlNP, AlNAs, AlNSb, AlPAs, AlPSb, InGaP, InNP, InNAs, InNSb, InPAs, InPSb and a mixture thereof; and quaternary compounds such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb and a mixture thereof.

Examples of the Group IV-VI nanocrystals may include binary compounds such as SnS, SnSe, SnTe, PbS, PbSe, PbTe and a mixture thereof; ternary compounds such as SnSeS, SnSeTe, SnSTe, PbSeS, PbSeTe, PbSTe, SnPbS, SnPbSe, SnPbTe and a mixture thereof; and quaternary compounds such as SnPbSSe, SnPbSeTe, SnPbSTe and a mixture thereof.

The shape of the quantum dots is not particularly limited and may have any suitable shape generally used in the art. For example, the quantum dots may have a spherical shape, a pyramidal shape and a multi-arm shape, or may be cubic nanoparticles, nanotubes, nanowires, nanofibers, nanoplatelets or the like. The above-described binary compounds, ternary compounds or quaternary compounds may be present in the particles at a uniform (e.g., substantially uniform) concentration, or may be present in the same particles at partially different concentrations.

The quantum dots may have a core-shell structure including a core comprising the nanocrystals and a shell surrounding the core. At the interface between the core and the shell, the gradient of the concentrate of atoms in the shell may decrease toward the center. The shells of the quantum dots may serve as a protective layer for maintaining the semiconductor properties by preventing or reducing chemical denaturation of the core and/or as a charging layer for imparting electrophoretic properties to the quantum dots. The shell may be either a single layer or multiple layers. Examples of the shell of the quantum dot may include an oxide of a metal or a non-metal, a semiconductor compound, a combination thereof, etc.

For example, examples of the metal or non-metal oxide may include, but is not limited to, binary compounds such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$ and NiO or ternary compounds such as $MgAl_2O_4$, $CoFe_2O_4$, $NiFe_2O_4$ and $CoMn_2O_4$.

Examples of the semiconductor compound may include, but is not limited to, CdS, CdSe, CdTe, ZnS, ZnSe, ZnTe, ZnSeS, GaAs, GaP, GaSb, HgS, HgSe, HgTe, InAs, InP, InSb, AlAs, AlP, AlSb, etc.

The light emitted from the first wavelength-converting material 3413 may have a full width of half maximum (FWHM) of the emission wavelength spectrum of approximately 45 nm or less, or approximately 40 nm or less, or approximately 30 nm or less. In this manner, the color purity and color gamut of the color displayed by the display device can be improved. In addition, the light output from the first wavelength-converting material 3413 may travel in different directions regardless of the incidence direction of the incident light. This can improve the side visibility of the display device.

A part of the blue light L provided from the first organic light-emitting element ED1 may not be converted into red light by the first wavelength-converting material 3413. The components that are incident on the first color filter 331 without being converted by the first wavelength conversion pattern 341 can be blocked by the first color filter 331. On the other hand, the red light converted by the first wavelength conversion pattern 341 may pass through the first color filter 331 to exit to the outside. Accordingly, the first exit light L1 exiting to the outside from the first light-exiting area PA1 may be red light.

The first scatterers 3415 may have a refractive index different from that of the first base resin 3411 and may form an optical interface with the first base resin 3411. For example, the first scatterers 3415 may be light scattering particles. The material of the first scatterers 3415 is not particularly limited as long as they can scatter at least a part of the transmitted light. For example, the scatterers 450 may be metal oxide particles or organic particles. Examples of the metal oxide may include titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), etc. Examples of the material of the organic particles may include an acrylic resin, a urethane resin, etc. The first scatterers 3415 can scatter the light transmitted through the first wavelength conversion pattern 341 in random directions regardless of the direction in which the incident light is coming, without substantially changing the wavelength of the light. By doing so, the length of the path in which the light passes through the first wavelength conversion pattern 341 can be increased, and the color conversion efficiency by the first wavelength-converting material 3413 can be increased.

The thickness of the first wavelength conversion pattern 341 may be approximately 3 to 15 μm. When the first wavelength conversion pattern 341 is formed to have a thickness of 3 μm or more, the color conversion efficiency of light passing through the first wavelength conversion pattern 341 can be improved. The upper limit of the thickness of the first wavelength conversion pattern 341 may be approximately 15 μm for easy processing.

The content of the first wavelength-converting material 3413 included in the first wavelength conversion pattern 341 may range from 10% to 60%. The content of the first scatterers 3415 included in the first wavelength conversion pattern 341 may range from 2% to 15%.

The second wavelength conversion pattern 343 may be in the second light-exiting area PA2 and not in the first light-exiting area PA1 and the third light-exiting area PA3. The second wavelength conversion pattern 343 may convert the peak wavelength of the incident light into light of another peak wavelength so that the light exits. For example, the second wavelength conversion pattern 343 may convert blue light into green light in the range of approximately 510 to 550 nm.

The second wavelength conversion pattern 343 may include a second base resin 3431 and a second wavelength-converting material 3433 dispersed in the second base resin 3431, and may further include second scatterers 3435 dispersed in the second base resin 3431.

The material of the second base resins 3431 is not particularly limited as long as it has a high light transmittance and the second wavelength-converting material 3433 and the second scatters 3435 can be dispersed well therein. For example, the second base resin 3431 may include an organic material such as an epoxy resin, an acrylic resin, a cardo resin, or an imide resin.

As described above, the second wavelength-converting material 3433 may convert the peak wavelength of the incident light into light of another peak wavelength. The second wavelength-converting material 3433 may convert blue light having a peak wavelength in the range of 430 to 470 nm into green light having a peak wavelength in the range of 510 to 550 nm.

Examples of the second wavelength-converting material 3433 may include quantum dots, quantum rods or phosphors. The second wavelength-converting material 3433 is substantially identical to the first wavelength-converting material 3413; and, therefore, the redundant description will be omitted.

The first wavelength-converting material 3413 and the second wavelength-converting material 3433 may all be quantum dots. In such case, the diameter of the quantum dots forming the first wavelength-converting material 3413 may be larger than the diameter of the quantum dots forming the second wavelength-converting material 3433. For example, the quantum dot size of the first wavelength-converting material 3413 may be approximately 55 to 65 Å. In addition, the quantum dot size of the second wavelength-converting material 3433 may be approximately 40 to 50 Å.

After the light passes through the first wavelength conversion pattern 341 and the second wavelength conversion pattern 343, the polarization of the light may be cancelled, e.g., in an unpolarized state. The unpolarized light refers to the light that does not consist only of polarization components in a set or particular direction, e.g., that includes (e.g., consists of) random polarization components that are not polarized in a set or particular direction. An example of the unpolarized light may be natural light.

The second scatterers 3435 may have a refractive index different from that of the second base resin 3431 and may form an optical interface with the second base resin 3431. For example, the second scatterers 3435 may be light scattering particles. The second scatterers 3435 are substantially identical to the first scatterers 3415 described above; and, therefore, the redundant description will be omitted.

The thickness of the second wavelength conversion pattern 343 may be approximately 3 to 15 μm. When the second wavelength conversion pattern 343 is formed to have a thickness of 3 μm or more, the color conversion efficiency of light passing through the first wavelength conversion pattern 341 can be improved. The upper limit of the thickness of the second wavelength conversion pattern 343 may be approximately 15 μm for easy processing.

The content of the second wavelength-converting material 3433 included in the second wavelength conversion pattern 343 may range from 10% to 60%. The content of the second scatterers 3435 included in the second wavelength conversion pattern 343 may range from 2% to 15%.

The blue light emitted from the second organic light-emitting element ED2 may be provided to the second wavelength conversion pattern 343. The second wavelength-converting material 3433 may convert the blue light provided from the second organic light-emitting element ED2 into green light having a peak wavelength in the range of approximately 510 to 550 nm.

A part of the blue light L provided from the second organic light-emitting element ED2 may not be converted into green light by the second wavelength-converting material 3433 but may be blocked by the second color filter 333. On the other hand, a part of the blue light L that is provided from the second organic light-emitting element ED2 and is converted into the green light by the second wavelength conversion pattern 343 may pass through the second color filter 333 and exit to the outside. Accordingly, the second exit light L2 exiting to the outside from the second light-exiting area PA2 may be green light.

The light transmission pattern 345 may be in the third light-exiting area PA3 and not in the first light-exiting area PA1 and the second light-exiting area PA2. The light transmission pattern 345 can transmit incident light.

The light transmission pattern 345 may further include a third base resin 3451 and third scatterers 3455 dispersed in the third base resin 3451.

The third base resin 3451 may be made of an organic material having a high transmittance and may be made of the same material as the first base resin 3411, or may include at least one of the materials listed above as the examples of the constituent materials of the first base resin 3411.

The third scatterers 3455 may have a refractive index different from that of the third base resin 3451 and may form an optical interface with the third base resin 3451. For example, the third scatterers 3455 may be light scattering particles. The material of the third scatterers 3455 is not particularly limited as long as they can scatter at least a part of the transmitted light. For example, the scatterers 450 may be metal oxide particles or organic particles. Examples of the metal oxide may include titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), etc. Examples of the material of the organic particles may include an acrylic resin, a urethane resin, etc. The third scatterers 3455 can scatter the light transmitted through the first wavelength conversion pattern 341 in random directions regardless of the direction in which the incident light is coming, without substantially changing the wavelength of the light. In this manner, the side visibility of the light passing through the light transmission pattern 345 can be improved.

The blue light L provided from the third organic light-emitting element ED3 passes through the light transmission pattern 345 and the third color filter 335 and exits to the outside. For example, the third exit light L3 escaping from the third light-exiting area PA3 may have the same (e.g., substantially the same) wavelength as the blue light L emitted from the third organic light-emitting element ED3.

The areas of the first wavelength conversion pattern 341, the second wavelength conversion pattern 343 and the light transmission pattern 345 may be in proportion to the areas of the first light-exiting area PA1, the second light-exiting area PA2, and the third light-exiting area PA2, respectively, and thus may be different from one another. It is, however, to be understood that the present disclosure is not limited thereto. The first wavelength conversion pattern 341, the second wavelength conversion pattern 343, and the light transmission pattern 345 may have the same (e.g., substantially the same) area.

The light modulation patterns 340 may have a shape protruding in the thickness direction. For example, the light modulation patterns 340 may have a shape protruding toward the first substrate 10. The first wavelength conversion pattern 341, the second wavelength conversion pattern 343 and the light transmission pattern 345 may have substantially the same height. It is, however, to be understood that the present disclosure is not limited thereto. They may have different heights or two of them may have the same height and the other of them may have a different height.

In some exemplary embodiments, a first low-refractive layer may be further between the first capping layer PS1 and the light modulation patterns 340. The first low-refractive layer may be located across the first light-exiting area PA1, the second light-exiting area PA2, the third light-exiting area PA3, and the non-light-exiting area PB. The first low-refractive layer may have a lower refractive index than the light modulation patterns 340. For example, the difference in the refractive index between the light modulation patterns 340 and the first low-refractive layer may be equal to or greater than 0.3. The first low-refractive layer may include a base resin and particles dispersed in the base resin. The particles included in the first low-refractive layer may be at least one of: zinc oxide (ZnO) particles, titanium dioxide (TiO2) particles, hollow silica particles, non-hollow silica particles, nano silicate particles and porogen particles.

The first low-refractive layer may reflect a part of the light exiting toward the second base 310 from the light modulation patterns 340 back to the light modulation patterns 340. For example, the first low-refractive layer recycles at least part of the light traveling toward the second base 310, thereby improving the light utilization efficiency and improving the luminous efficiency of the display device.

On the light modulation patterns 340, the second capping layer PS2 may be located. The second capping layer PS2 may cover the first wavelength conversion pattern 341 and the second wavelength conversion pattern 343 and may also be on the light transmission pattern 345 to cover it.

The second capping layer PS2 may seal the light modulation patterns 340 together with the first capping layer PS1 so that it is possible to prevent or reduce damage or contamination from impurities such as moisture and air introduced from the outside to the light modulation patterns 340. In some exemplary embodiments, the second capping layer PS2 may be made of an inorganic material. The second capping layer PS2 may be made of the same (e.g., substantially the same) material as the first capping layer 351 or may include at least one of those listed above as the materials of the first capping layer 391. In an exemplary embodiment, the third capping layer PS3 may be made of silicon nitride. The second capping layer PS2 may conformally reflect the surface step differences of the light modulation patterns 340, and may include a concave-convex shape on its surface facing the first substrate 10. For example, a face or surface of the second capping layer PS2 may have convex portions in the regions where it overlaps with each of the light modulation patterns 340 in the thickness direction, while it may have convex portions in the regions wherein it overlaps with none of the light modulation patterns 340.

In some embodiments, a filter layer may be further on the light modulation patterns 340. The filter layer may be a reflective filter that transmits light having a set or particular wavelength range and reflects light having other wavelength ranges. For example, the filter layer may transmit blue light while reflecting red light and green light.

The filter layer recycles the red light and the green light, which is converted in the first wavelength conversion pattern 341 and the second wavelength conversion pattern 343 and exiting toward the first substrate 10, back to the second base 310, so that the light extraction efficiency can be improved. In addition, the filter layer transmits the blue light provided from the first organic light-emitting element ED1, the second organic light-emitting element ED2, and the third organic light-emitting element ED3 while reflecting the light having a longer center wavelength than the light of the third color, so that it is possible to improve the color purity of the blue light provided from the first organic light-emitting element ED1, the second organic light-emitting element ED2, and the third organic light-emitting element ED3.

The planarization layer OC may be further on the second capping layer PS2. When the thicknesses of the first wavelength conversion pattern 341, the second wavelength conversion pattern 343 and the light transmission pattern 345 are different from one another or when there is space among the elements during processes, the planarization layer OC can provide a generally flat surface over the different heights of the elements.

When the height of the elements are generally uniform (e.g., substantially uniform), the planarization layer OC may be eliminated.

The material of the planarization layer OC is not particularly limited herein as long as it can provide a flat surface. In an exemplary embodiment, the planarization layer OC may include an organic material. For example, the organic material may include a cardo-based resin, a polyimide-based resin, an acrylic-based resin, a siloxane-based resin, or a silsesquioxane-based resin.

The third capping layer PS3 may be further on the planarization layer OC. The third capping layer PS3 may completely cover the planarization layer OC. When the planarization layer OC is eliminated as described above, the third capping layer PS3 may also be eliminated. The third capping layer PS3 may be made of an inorganic material. The third capping layer PS3 may be made of the same (e.g., substantially the same) material as the first capping layer 351 or may include at least one of those listed above as the materials of the first capping layer 351.

In some exemplary embodiments, a fourth capping layer may be further at the outermost layer of the second substrate 30. For example, the fourth capping layer may be entirely on the third capping layer PS3 and may be in contact with the filler 70.

The fourth capping layer may include an oxide-rich metal oxide or non-metal oxide. The fourth capping layer may include metal or non-metal center atoms and oxide and nitrogen atoms that form covalent bonding with the center atom. In the fourth capping layer, the content of oxygen may be greater than the content of nitrogen. By applying the fourth capping layer, the filler 70 can be more reliably attached to the surface of the second substrate 30. A more detailed description of the structure and effects of the fourth capping layer will be given later.

The sealing member 50 may be between the first base 110 of the first substrate 10 and the second base 310 of the second substrate 30. The sealing member 50 may be in contact with a surface of the first base 110 and a surface of the second base 310 facing the first base 110. In other words, the surface of the first base 110 may be coupled with the surface of the second base 310 through the sealing member 50.

In an exemplary embodiment, the sealing member 50 may be formed on a surface of the first base 110 and then the second base 310 may be attached to it. In an exemplary embodiment, the sealing member 50 may be formed on a surface of the first base 110 and then the second base 310 may be attached to it. In another exemplary embodiment, the sealing member 50 may be formed on a surface of the second base 310, and then the first base 110 may be attached to it.

In an exemplary embodiment, the outer side surface of the sealing member 50 may be aligned with one side surface of the first substrate 10 and one side surface of the second substrate 30 in a thickness direction, as shown in FIGS. 2 and 5. The outer side surface of the sealing member 50 may have a straight shape in the thickness direction in cross section. The inner side surface of the sealing member 50 opposed to the outer side surface thereof may be more to the inside so as to be partially in contact with the filler 70. In addition, the inner side surface of the sealing member 50 may have a straight shape in the thickness direction in cross section, like the outer side surface thereof or may have a curved shape protruding toward the inside.

As described above, the filler 70 may be in the space surrounded by the first substrate 10, the second substrate 30 and the sealing member 50. In an exemplary embodiment, the non-display area NDA between the sealing area SA and the display area DA may even be filled with the filler 70, so that the entire space between the first substrate 10 and the second substrate 30 may be filled with it. In some embodiments, the filler 70 may not be in the non-display area NDA adjacent to the sealing area SA and an air layer may be included.

Figure 10:
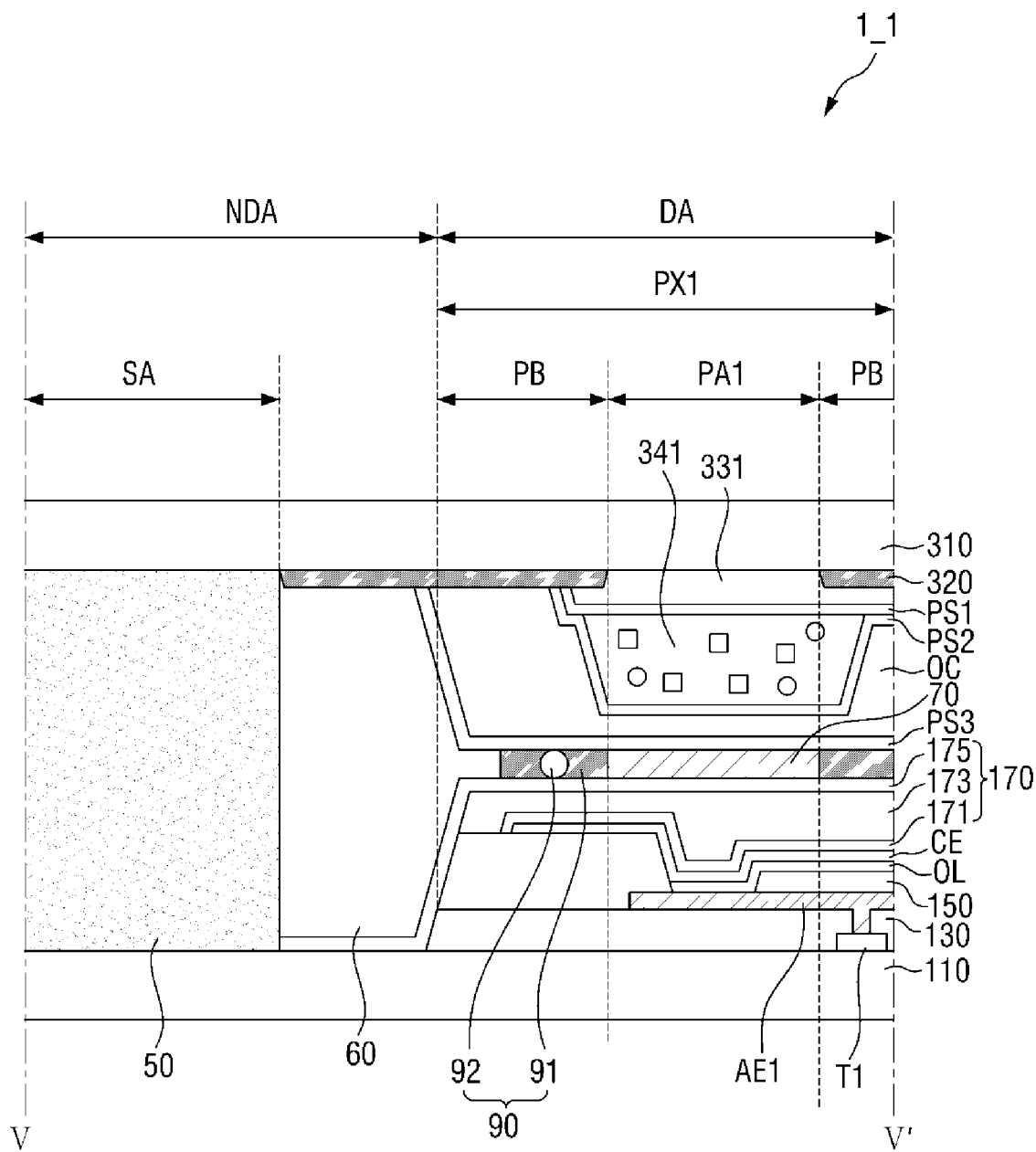
FIG. 10 is a cross-sectional view showing a modification of the structure shown in FIG. 5.

FIG. 10 is a cross-sectional view showing a modification of the structure shown in FIG. 5. FIG. 10 illustrates that an air layer 60 may be formed between the sealing member 50 and the filler 70.

The air layer 60 may be in the non-display area NDA between the sealing area SA and the display area DA when viewed from the top and may be between the first substrate 10 and the second substrate 30 in cross section. In addition, the air layer 60 may be in contact with the inner side surface of the sealing member 50 and the light-blocking/supporting member 90 to be described later at least partially.

The light-blocking/supporting member 90 may be formed on the first substrate 10 and then the filler 70 may be applied on the first substrate 10 and the light-blocking/supporting member 90. Subsequently, when the first substrate 10 and the second substrate 30 are attached together by the sealing member 50, the filler 70 may be only on the display area DA and on at least a part of the non-display area NDA but may not be in an area adjacent to the sealing area SA. For example, the air layer 60 may be formed in the area where the filler 70 is not located, which may depend on the manufacturing process.

Referring again to FIGS. 3 and 4, the light-blocking/supporting member 90 and the filler 70 may be between the first substrate 10 and the second substrate 30. The light-blocking/supporting member 90 may be between the first substrate 10 and the second substrate 20 to maintain the gap between the first substrate 10 and the second substrate 30 and can prevent or reduce light leakage to an undesirable light-exiting area. The filler 70 may be used to fill the space between the first substrate 10 and the second substrate 30 spaced apart from each other by the light-blocking/supporting member 90.

Initially, the light-blocking/supporting member 90 will be described. The light-blocking/supporting member 90 may include a light-blocking portion 91 and a plurality of supporting portions 92.

The light-blocking portion may be between the first substrate 10 and the second substrate 30 along the boundaries among the first pixels PX1, the second pixels PX2, and the third pixels PX3 and can provide transmission of light, like the light-blocking member 320. The light-blocking portion 91 may be formed in a lattice shape when viewed from the top and may prevent or reduce color mixing, which occurs when light crosses over the adjacent first light-exiting area PA1, the second light-exiting area PA2, and the third light-exiting area PA2.

The light-blocking portion 91 may be formed of an organic material containing at least one of graphite, carbon black, black pigment and black dye, or may be formed of a metal material including chromium (Cr). It is, however, to be noted that the material of the light-blocking member 320 is not particularly limited herein as long as it can block light transmission and absorb the light.

At least a part of the light-blocking portion 91 may overlap with the non-light-exiting area PB. In addition, the light-blocking portion 91 may be located to overlap with the light-blocking member 320 in the second substrate 30 in the thickness direction. In an exemplary embodiment, the width of the light-blocking portion 91 may be equal to the width of the light-blocking member 320 of the second substrate 30. In another exemplary embodiment, the width of the light-blocking portion 91 may be larger than the width of the light-blocking member 320. For example, the width of the light-blocking portion 91 may range from, but is not limited to, 100 to 150 µm.

The supporting portions 92 may be at any suitable position in the light-blocking portion 91. For example, the supporting portions 92 may be at the boundary between the first pixel PX1 and the second pixel PX2 and not at the boundary between the second pixel PX2 and the third pixel PX3, as shown in FIG. 3.

FIG. 3 shows an exemplary structure for illustrating the arrangement of the supporting portions 92. A smaller number of supporting portions 92 may be included than those shown in FIG. 3 as long as the gap between the first substrate 10 and the second substrate 30 can be maintained. It is to be understood that a larger number of supporting portions 92 than those shown in FIG. 3 may be included.

The supporting portions 92 may include a spherical material of an organic or inorganic material. For example, the supporting portions 92 may include a spherical organic material such as polystyrene, or a spherical inorganic material such as silica. It is to be understood that the material and shape of the supporting portion 92 are not particularly limited herein as long as it can be between the first substrate 10 and the second substrate 30 to support them.

The light-blocking/supporting member 90 may be formed on the first substrate 10 via an inkjet process or a reverse off-set process. For example, the light-blocking/supporting member 90 may be formed by patterning a light-blocking portion 91 (e.g., a liquid-phase light-blocking portion) and the supporting portions 92 mixed in the light-blocking portion 91 on the first substrate 10 via an inkjet process or a reverse off-set process.

By forming the light-blocking/supporting member 90 on the first substrate 10 and then attaching the second substrate 30 to it, it is possible to prevent or reduce misalignment between the first organic light-emitting element ED1, the second organic light-emitting element ED2, and the third organic light-emitting element ED3 in the first substrate 10 and the light-blocking/supporting member 90. It is to be understood that the light-blocking/supporting member 90 may be formed on the second substrate 30 and then the first substrate 10 may be attached to it as long as the light-blocking/supporting member 90 can be aligned with the first organic light-emitting element ED1, the second organic light-emitting element ED2, and the third organic light-emitting element ED3 in the first substrate 10.

The method of forming the light-blocking/supporting member 90 is not limited thereto. In some exemplary embodiments, the light-blocking/supporting member 90 may be formed by forming the light-blocking portion 91 in which the supporting portions 92 are mixed entirely on the first substrate 10, and patterning the same via a photolithography process.

Hereinafter, the structure and modifications of the light-blocking/supporting member 90 will be described in more detail with reference to FIGS. 11 and 12.

Figure 11:
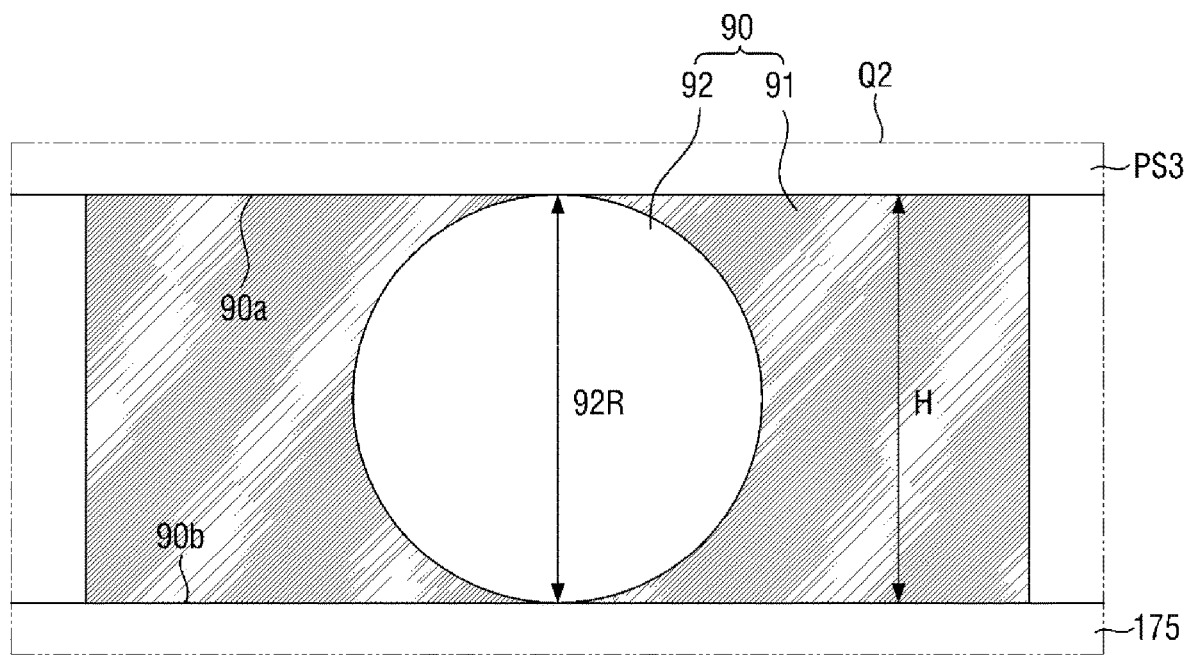
FIG. 11 is an enlarged view of area Q2 in FIG. 4.

FIG. 11 is an enlarged view of area Q2 in FIG. 4. FIG. 12 is an enlarged view of area Q2 of the display device according to another exemplary embodiment.

Referring to FIGS. 4 and 11, the light-blocking/supporting member 90 may be in contact (e.g., physical contact) with the outermost surface of the first substrate 10 and the outermost surface of the second substrate 30. For example, the lower surface 90b of the light-blocking/supporting member 90 may be in contact with the second inorganic encapsulation layer 175 of the first substrate 10, while the upper surface 90a of the light-blocking/supporting member 90 may be in contact with the third capping layer PS3 of the second substrate 30. When another layer (for example, a fourth capping layer or a fifth capping layer) is further formed on the outermost portion of the first substrate 10 or the second substrate 30, the light-blocking/supporting member 90 may be in contact with the layer.

At least a part of the supporting portion 92 in the light-blocking/supporting member 90 may be in contact with the outermost surface of the first substrate 10 or the outermost surface of the second substrate 30.

As shown in FIG. 11, the supporting portion 92 may be in contact with the second inorganic encapsulation layer 175 of the first substrate 10 and the third capping layer PS3 of the second substrate 30. For example, the supporting portion 92 can support the first substrate 10 and the second substrate 30 so that the gap therebetween is maintained. The distance between the first substrate 10 and the second substrate 30 may be equal to the diameter of the supporting portion 92. The thickness of the light-blocking portion 91 may be equal to the diameter of the supporting portion 92 as well.

The diameter of the supporting portion 92 may range from 2 to 12 μm, or, for example, from 4 to 8 μm. When the diameter of the supporting portion 92 is 12 μm or less, the color gamut of the display device can be sufficiently improved. The lower limit of the diameter of the supporting portion 92 may be approximately 2 μm for easy processing.

The gap between the first substrate 10 and the second substrate 30 can be reduced as the diameter of the supporting portion 92 is smaller, and as the gap between the first substrate 10 and the second substrate 30 is reduced, the color gamut and the light extraction efficiency of the display device can be improved.

Although the supporting portion 92 is located at the center of the light-blocking portion 91 in the cross section in the example shown in FIG. 11, this is merely illustrative. The supporting portion 92 may be located on the right or left side with respect to the center of the light-blocking portion 91.

Hereinafter, a modification of the light-blocking/supporting member 90 will be described with reference to FIG. 12.

Figure 12:
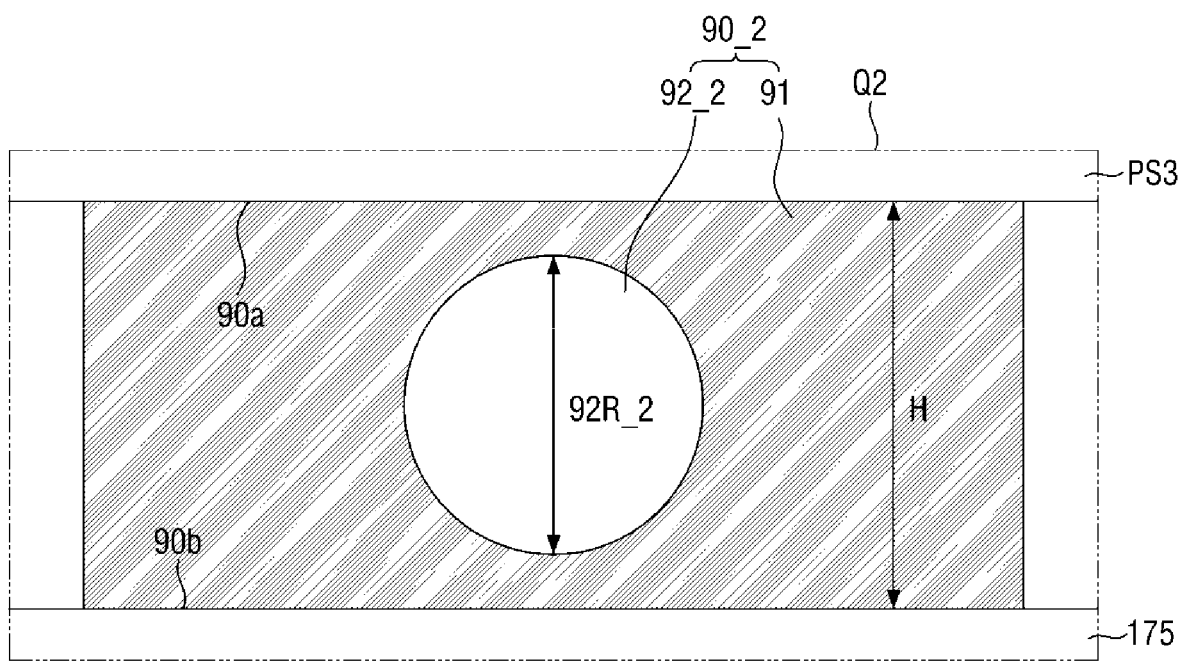
FIG. 12 is an enlarged view of area Q2 of the display device according to another exemplary embodiment.

In the example shown in FIG. 12, a supporting portion 92_2 is in the light-blocking portion 91 but is in contact neither with the first substrate 10 nor with the second substrate 30.

During the process of forming the light-blocking/supporting member 90_2, the supporting portion 92_2 is dispersed in the light-blocking portion 91, such that it may be cured in the light-blocking portion 91 as it is floating without being in contact with the first substrate 10. In addition, the light-blocking portion 91 may cover the supporting portion 92_2 and coat the upper portion of the supporting portion 92_2. For example, the supporting portion 92_2 may not be in contact with the second substrate 30. Therefore, the gap between the first substrate 10 and the second substrate 30 may be larger than the diameter 92R_2 of the supporting portion 92_2. The thickness of the light-blocking portion 91 may be larger than the diameter 92R_2 of the supporting portion 92_2.

The supporting portion 92 may be between the first substrate 10 and the second substrate 20 to generally maintain the gap between the first substrate 10 and the second substrate 30. In addition, even if a pressure is applied in the thickness direction of the first substrate 10 and the second substrate 30, the gap between the first substrate 10 and the second substrate 30 can be maintained at least larger than the diameter 92R_2 of the supporting portion 92_2.

Although the supporting portion 92_2 is not in contact with the first substrate 10 and the second substrate 30 in the example shown in FIG. 12, this is merely illustrative. The supporting portion 92_2 may be in contact with the first substrate 10 but not with the second substrate 30, or may be in contact with the second substrate 30 but not with the first substrate 10.

Hereinafter, display devices according to other exemplary embodiments of the present disclosure will be described. In the following description, the same or similar elements will be denoted by the same or similar reference numerals, and redundant descriptions will be omitted or briefly described.

FIGS. 13 to 16 are views for illustrating various arrangements of the supporting portions 92 in the light-blocking/supporting member 90.

Figure 13:
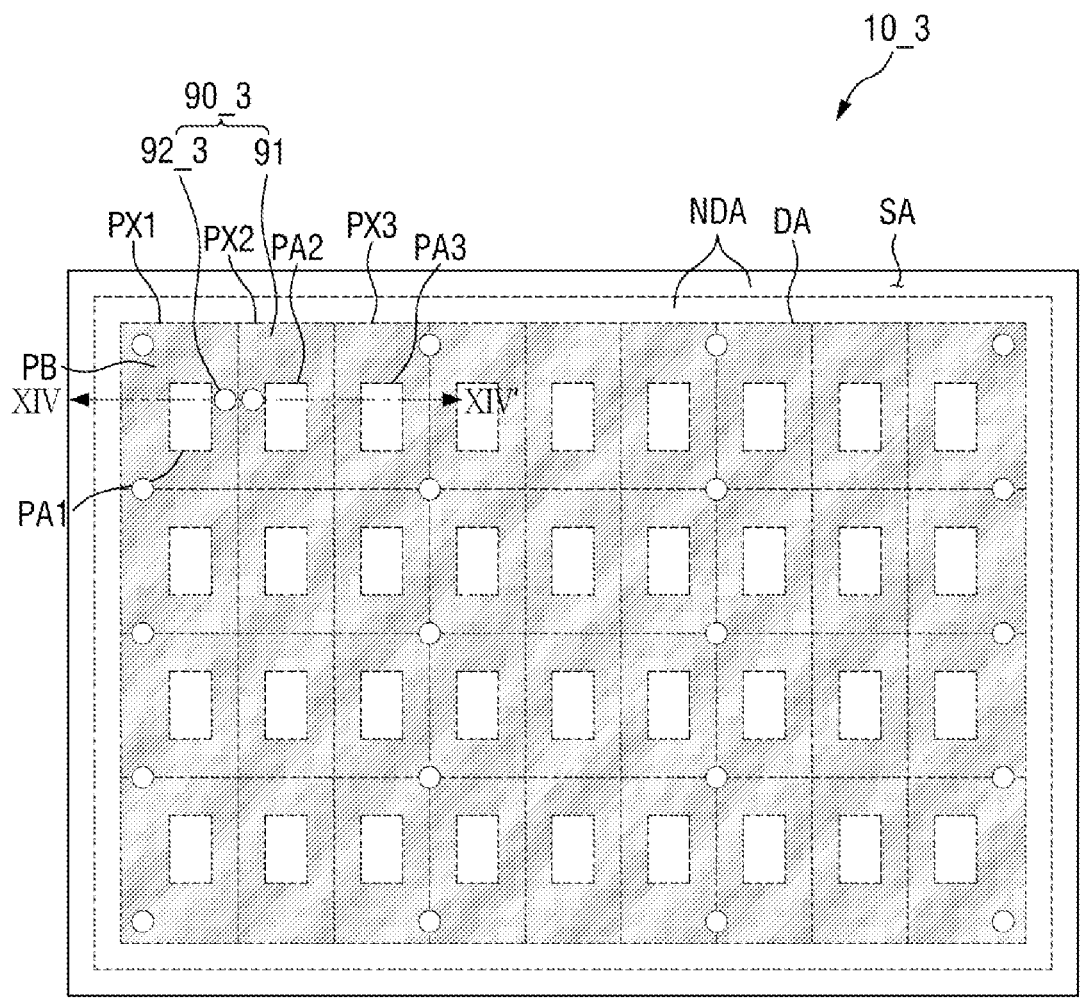
FIG. 13 is a schematic plan view of a display device according to yet another exemplary embodiment.
Figure 14:
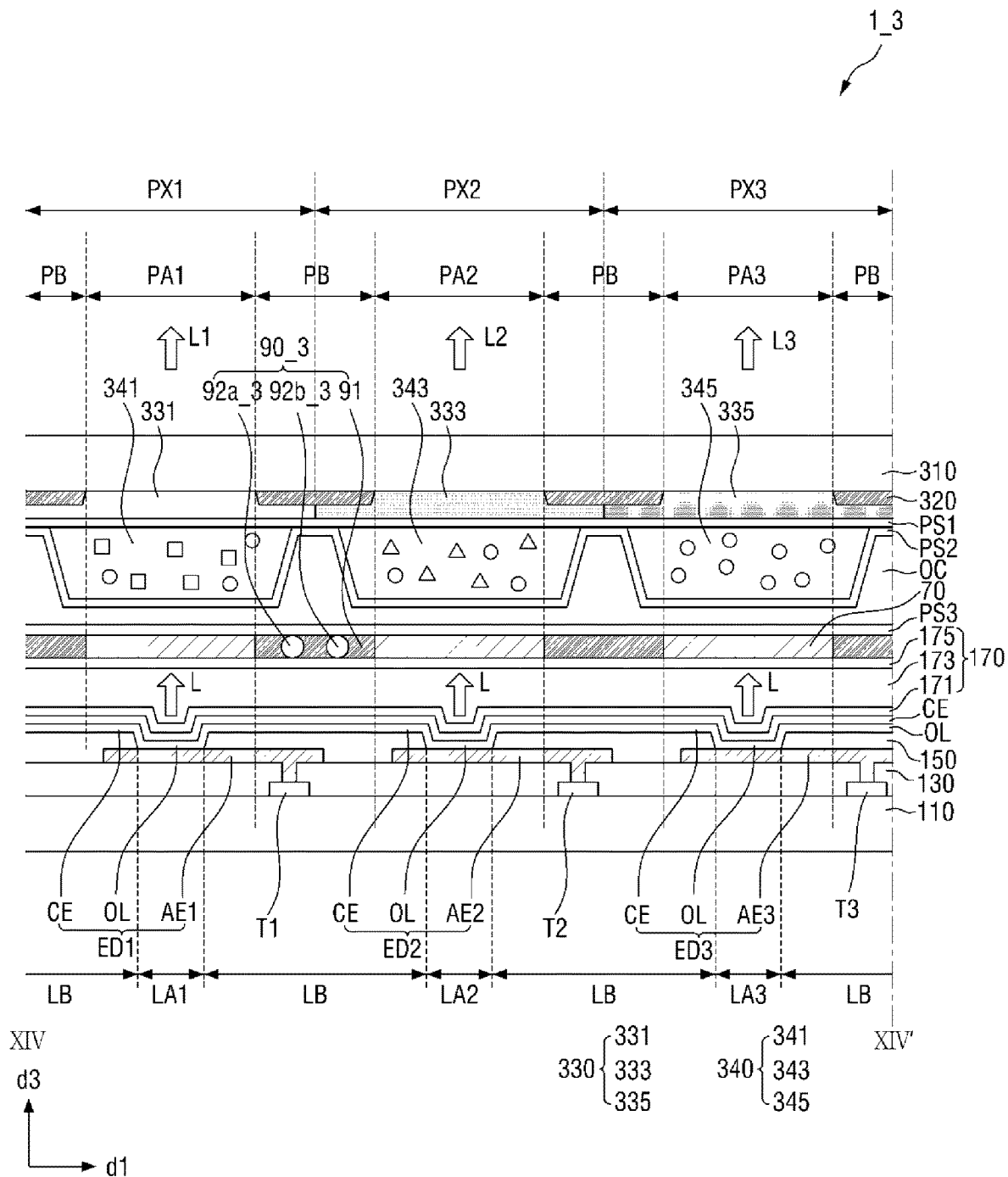
FIG. 14 is a cross-sectional view of a display device, taken along line XIV-XIV' of FIG. 13.
Figure 15:
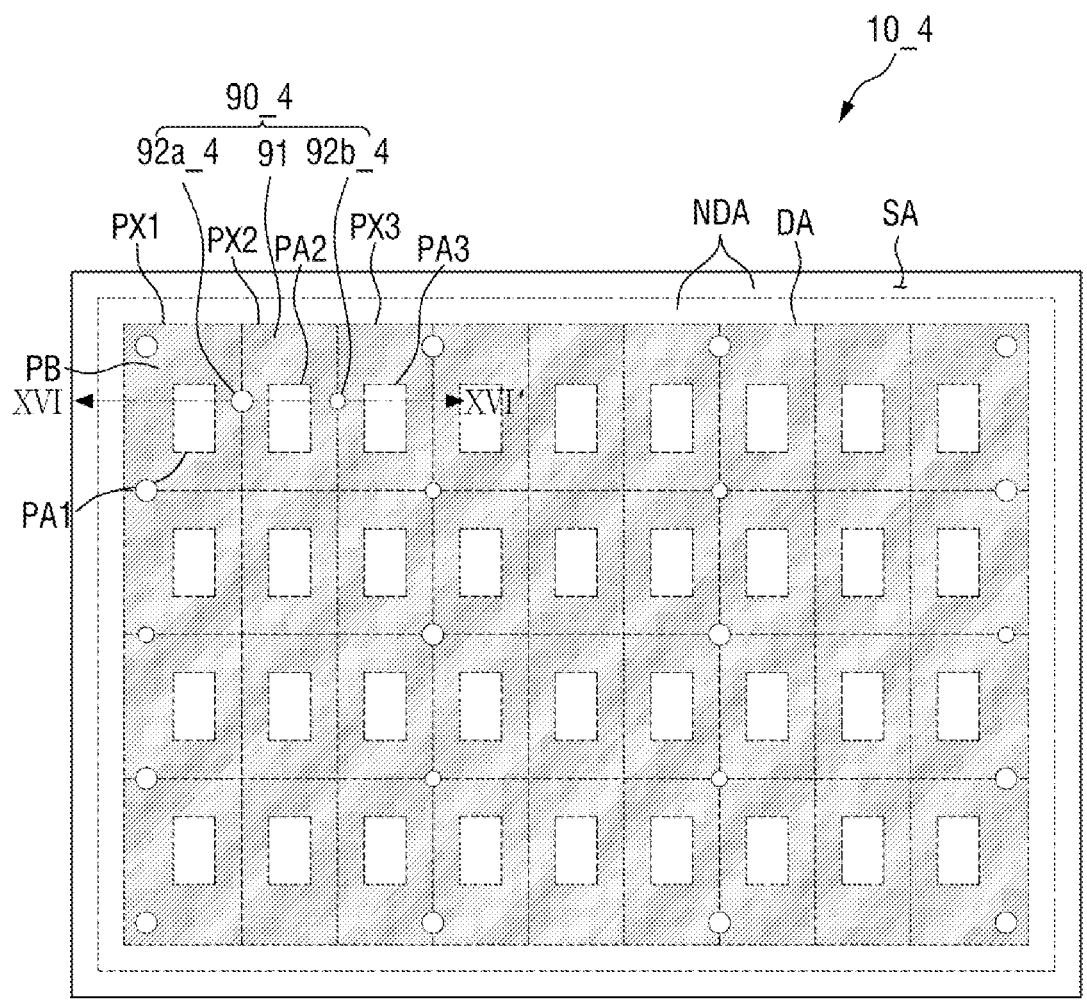
FIG. 15 is a schematic plan view of a display device according to yet another exemplary embodiment.
Figure 16:
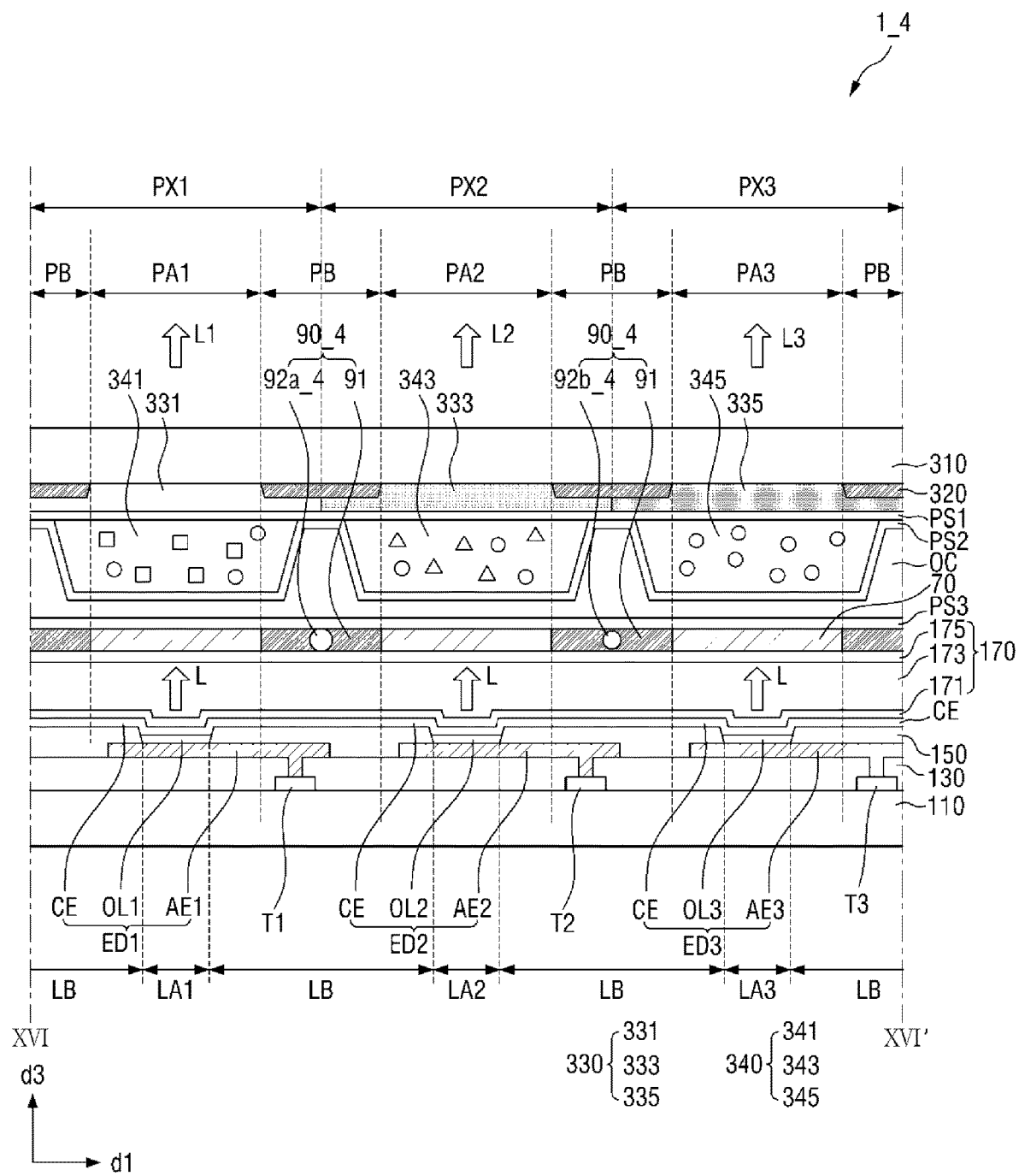
FIG. 16 is a cross-sectional view of a display device, taken along line XVI-XVI' shown in FIG. 15.

FIG. 13 is a schematic plan view of a first substrate according to yet another exemplary embodiment. FIG. 14 is a cross-sectional view of a display device, taken along line XIV-XIV' of FIG. 13. FIG. 15 is a schematic plan view of a first substrate according to yet another exemplary embodiment. FIG. 16 is a cross-sectional view of a display device, taken along line XVI-XVI' shown in FIG. 15.

Referring to FIGS. 13 and 14, a light-blocking/supporting member 90_3 may include a light-blocking portion 91 and a plurality of supporting portions 92_3. The light-blocking portion 91 may be along the boundaries of the first pixels PX1, the second pixels PX2, and the third pixels PX3 and may block transmission of light. The supporting portions 92_3 may be at any suitable position within the light-blocking portion 91 to maintain the gap between the first substrate 10_3 and the second substrate 30.

As described above, according to the exemplary embodiment of FIGS. 13 and 14, a plurality of supporting portions 92_3 may be at the boundaries of the first pixels PX1, the second pixels PX2, and the third pixels PX3, unlike the exemplary embodiment of FIGS. 13 and 14. Although two supporting portions 92a_3 and 92b_3 are adjacent to each other at the boundary between the first pixel PX1 and the second pixel PX2 in the example shown in FIGS. 13 and 14, it is to be understood that more than two supporting portions 92_3 may be at boundaries between other pixels.

For convenience of illustration, the size of the supporting portions 92a_3 and 92b_3 are exaggerated. The width of the light-blocking portion 91 at the boundary of the first pixels PX1, the second pixels PX2, and the third pixels PX3 may be several tens of times larger than the diameter of the supports 92a_3 and 92b_3. For example, when the number of the supporting portions 92_3 to be mixed in the light-blocking portion 91 increases, the number of the supporting portions 92_3 at the boundaries of the first pixels PX1, the second pixels PX2, and the third pixels PX3 may increase to two or more.

When two or more supporting portions 92a_3 and 92b_3 are adjacent to each other at the boundaries of the first pixels PX1, the second pixels PX2, and the third pixels PX3, the gap between the first substrate 10_3 and the second substrate 30 can be more effectively maintained. For example, a pressure applied in the thickness direction of the first substrate 10_3 and the second substrate 30 may be distributed across the plurality of supporting portions 92a_3 and 92b_3 supporting them. In addition, even if one supporting portion 92a_3 is damaged during the manufacturing process such that it cannot support the substrates, the other supporting portion 92b_3 can support them, thereby more reliably maintaining the gap.

Referring to FIGS. 15 and 16, a light-blocking/supporting member 90_3 may include a light-blocking portion 91 and a plurality of supporting portions 92a_4 and 92b_4 having different sizes. The light-blocking portion 91 may be along the boundary of each of the first pixels PX1, the second pixels PX2, and the third pixels PX3 and may block transmission of light. The supporting portions 92a_4 and 92b_4 may be at any suitable position within the light-blocking portion 91 to maintain the gap between the first substrate 10_4 and the second substrate 30.

In the example shown in FIGS. 15 and 16, a light-blocking/supporting member 90_4 including a first supporting portion 92a_4 is between the first pixel PX1 and the second pixel PX2, and a light-blocking/supporting member 90_4 including a second supporting portion 92b_4 smaller than the first supporting portion 92a_4 is between the second pixel PX2 and the third pixel PX3.

When the supporting portions 92 having different sizes are included, the first supporting portion 92a_4 having a larger size may serve as the main spacer which maintains the gap between the first substrate 10_4 and the second substrate 30 whereas the second supporting portion 92b_4 having a smaller size than the first supporting portion 92a_4 may serve as a subsidiary spacer.

In some embodiments, normally the gap between the first substrate 10_4 and the second substrate 30 may be maintained by the first supporting portion 92a_4, and the gap may be maintained by the second supporting portion 92b_4 when a pressure is applied which is larger than the pressure that can be supported by the first supporting portion 92a_4.

According to the exemplary embodiment shown in FIGS. 15 and 16, the first supporting portion 92a_4 and the second supporting portion 92b_4 having different sizes are included. However, more than two supporting portions 92 may be included as well.

The structure of the light-blocking/supporting member 90 described in FIGS. 12 to 16 can be applied to the above-described exemplary embodiments as well as the exemplary embodiments to be described later. For example, the light-blocking/supporting member 90 may include a plurality of supporting portions 92, such that two or more supporting portions 92 may be applied between the every two of the pixels and may include supporting portions 92 having different sizes.

Next, the filler 70 will be described with reference back to FIG. 4. The filler 70 may be used to fill each region partitioned by the first substrate 10, the second substrate 30 and the light-blocking/supporting member 90. For example, the filler 70 may be partially in contact with the thin encapsulation layer 170 of the first substrate 10 in the display area DA, and may be partially in contact with the third capping layer PS3 of the second substrate 30. In some exemplary embodiments, the filler 70 may be partially in contact with the inner side surface of the sealing member 50 in the sealing area SA.

The level differences on the surface of the second substrate 30 facing the first substrate 10 can be evenly filled with the filler 70, so that it is possible to prevent or reduce physical damage to the plurality of elements of the first substrate 10 thereunder by the level differences.

Furthermore, the filler 70 may be made of a material that can absorb shock and thus may serve as a buffer member that absorbs shock generated between the first substrate 10 and the second substrate 30, as described above.

For example, the filler 70 may include an organic material having a high refractive index such as a silicon-based organic material, an epoxy-based organic material and an epoxy-acrylic based organic material. In some exemplary embodiments, the filler 70 may include a silicone rubber. The filler 70 may have a refractive index of, for example, 1.4 or more, and when the filler 70 includes a high-refractive organic material, the optical properties of the display device can be improved.

In some embodiments, when the refractive index of the filler 70 is higher than the refractive index of the light-blocking portion 91 between the first pixels PX1, the second pixels PX2, and the third pixels PX3, a part of the light emitted from the light-emitting elements ED may be reflected at the boundary between the filler 70 and the light-blocking/supporting member 90 to exit upwardly.

The light-blocking/supporting member 90 may be formed on the first substrate 10 and then the filler 70 may be formed on the first substrate 10 and the light-blocking/supporting member 90 via a process capable of applying a liquid. For example, the filler 70 may be formed via, but not limited to, one drop filling (ODF), inkjet process, liquid dispensing process, etc.

If the thickness of the filler 70 is increased, there may be defects, e.g., some portion is not filled or stain may occur. As described above, the thickness of the filler 70 between the first substrate 10 and the second substrate 30 may also be reduced as long as the gap between the first substrate 10 and the second substrate 30 can be kept narrow by the light-blocking/supporting member 90. For example, it is possible to reduce defects caused by the filler 70.

FIGS. 17 to 23 are cross-sectional views of display devices according to a variety of exemplary embodiments of the present disclosure.

Figure 17:
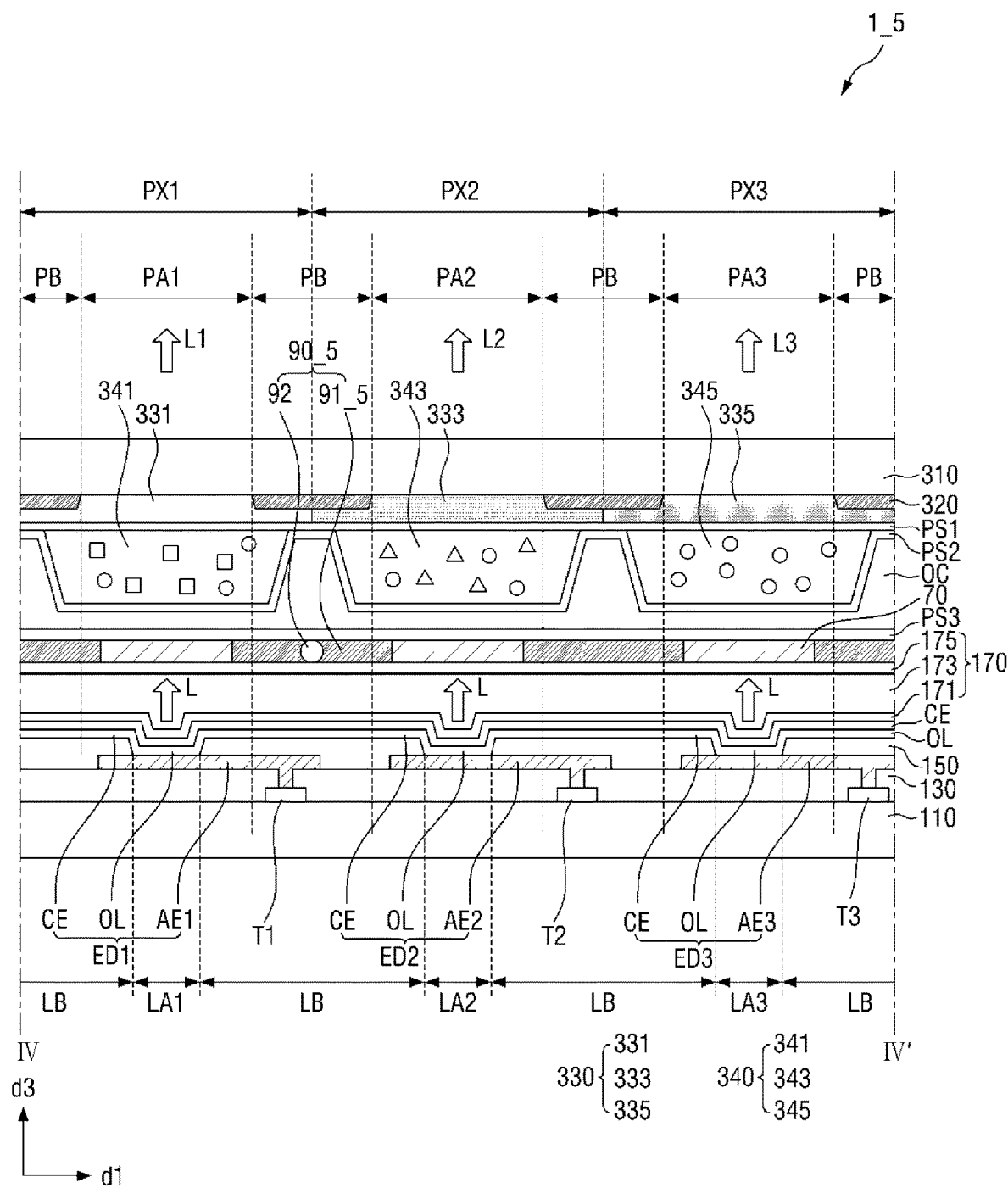
FIGS. 17 to 23 are cross-sectional views of display devices according to a variety of exemplary embodiments of the present disclosure.

The exemplary embodiment of FIG. 17 is substantially identical to the exemplary embodiment of FIG. 4 except that the width of a light-blocking/supporting member 90_5 is larger than the width of the light-blocking member 320 of the second substrate 30; and, therefore, the redundant description will be omitted.

Referring to FIG. 17, the second substrate 30 may include the light-blocking member 320 along the boundary of the first pixels PX1, the second pixels PX2, and the third pixels PX3, and the light-blocking/supporting member 90_5 may be between the first substrate 10 and the second substrate 30 so that it overlaps with the light-blocking member 320.

The light-blocking/supporting member 90_5 may include a light-blocking portion 91_5 and a supporting portion 92, and the width of the light-blocking/supporting member 90_5 may be larger than the width of the light-blocking member 320 of the second substrate 30. For example, at least a part of the light-blocking/supporting member 90_5 may overlap with each of the first light-exiting area PA1, the second light-exiting area PA2, and the third light-exiting area PA3.

As the width of the light-blocking/supporting member 90_5 is increased, it is possible to effectively prevent or reduce entrance of the light emitted from the first organic light-emitting element ED1, the second organic light-emitting element ED2, and the third organic light-emitting element ED3 overlapping with the first light-exiting area PA1, the second light-exiting area PA2, and the third light-exiting area PA3, respectively, to other light-exiting areas. For example, when the light emitted from the second organic light-emitting element ED2 of the second light-exiting area PA2 enters the first light-exiting area PA1 or the third light-exiting area PA3, light may exit from the first light-exiting area PA1 or the third light-exiting area PA3, which is undesirable. Therefore, by increasing the width of the light-blocking/supporting member 90_5, it is possible to more effectively block light leakage that otherwise enters adjacent light-exiting areas.

Figure 18:
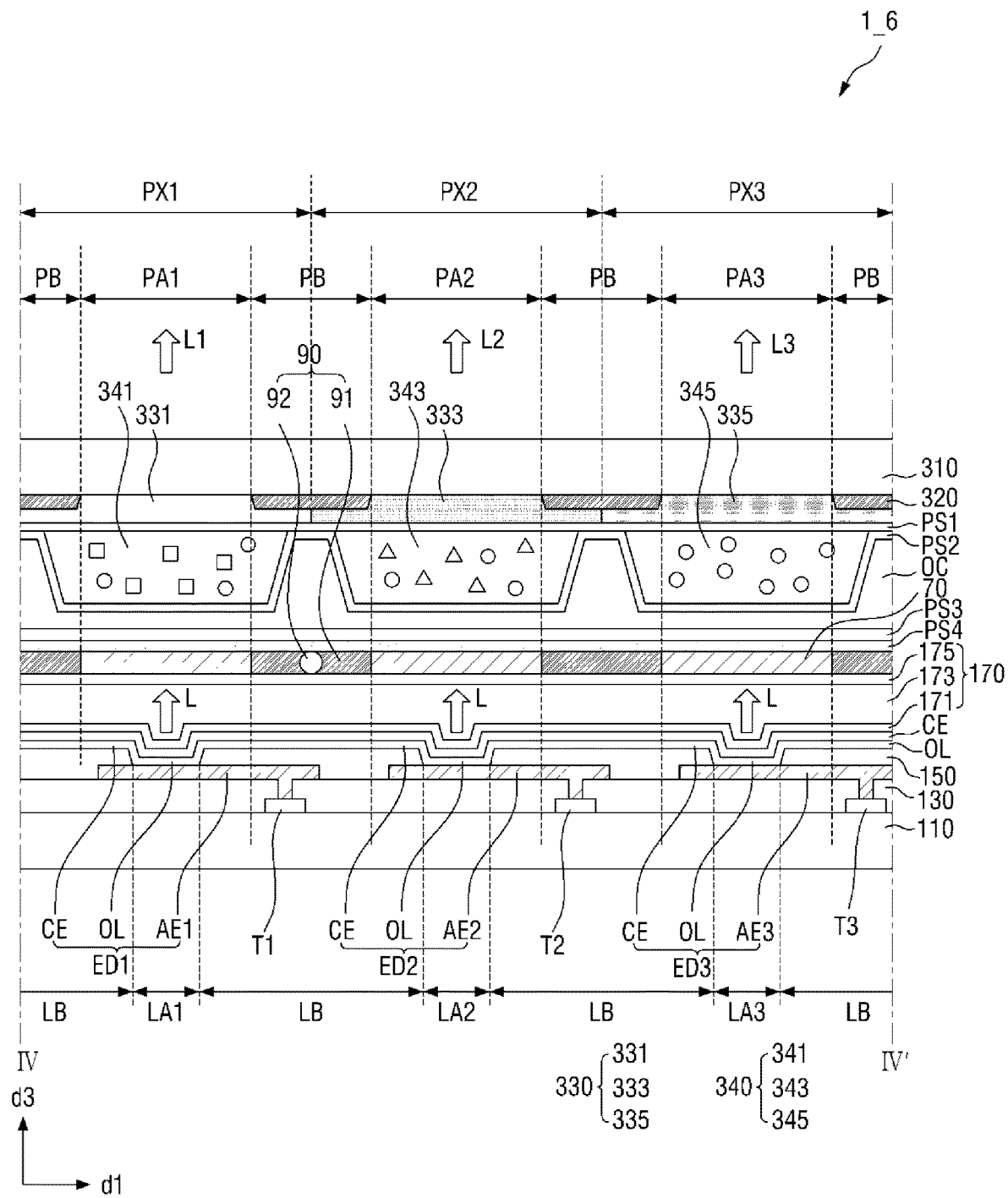

The exemplary embodiment of FIG. 18 is substantially identical to the exemplary embodiment of FIG. 4 except that a fourth capping layer PS4 is further on the outermost portion of the second substrate 30; and, therefore, redundant description thereof will not be repeated here.

Referring to FIG. 18, the fourth capping layer PS4 may be further between the third capping layer PS3 of the second substrate 30 and the filler 70. The fourth capping layer PS4 may include an oxide-rich metal oxide or non-metal oxide as described above. The fourth capping layer PS4 may include metal or non-metal center atoms and oxide and nitrogen atoms that form covalent bonding with the center atom. In the fourth capping layer PS4, the content of oxygen may be greater than the content of nitrogen.

The fourth capping layer PS4 may include a plurality of materials represented by the chemical formula $AO_XN_Y$. The symbol A may represent the element symbol of the central atom of the fourth capping layer PS4. The central atom (A) may include a metal or non-metal central atom. When the central atom (A) includes a metal center atom, the central atom (A) may include aluminum (Al). When the central atom (A) includes a non-metal central atom, the central atom (A) may include silicon (Si). The first content (X) may represent the content of oxygen in a single molecule of the material, and the second content (Y) may represent the content of nitrogen in the molecule of the material. Each of the first content (X) and the second content (Y) may have a value greater than zero and less than one. A single molecule of the material may include either more oxygen or more nitrogen depending on the relative values of the first content (X) and the second content (Y). According to an exemplary embodiment of the present disclosure, $AO_XN_Y$ may have the first content (X) greater than the second content (Y). For example, the content of oxygen may be larger than the content of nitrogen in a single molecule of the material. In an exemplary embodiment, the fourth capping layer PS4 may include silicon (Si) as the center atom A.

The fourth capping layer PS4 may be deposited on a surface of the third capping layer PS3 of the second substrate 30 by plasma enhanced chemical vapor deposition (PECVD). The PECVD may be carried out under a temperature of approximately 70 to 300° C.

The process temperature of the PECVD may be determined by taking into account thermal vulnerability and process efficiency of the elements near or around the deposition target. For example, the process temperature of PECVD may be at least approximately 150° C. in terms of process efficiency. Further, it may be approximately 250° C. or less in consideration of the thermal vulnerability of the elements thereon around the fourth capping layer PS4, for example, the first wavelength conversion pattern 341 and the second wavelength conversion pattern 343. Thus, the temperature of the deposition process of the fourth capping layer PS4 may, for example, be approximately 150 to 250° C. in view of process efficiency and thermal vulnerability of the elements around the deposition target. It is, however, to be understood that the present disclosure is not limited thereto. If it is desired to increase the process efficiency, the temperature of the deposition process may be 250° C. or higher. If it is desired to protect elements vulnerable to heat, the temperature of the deposition process may be 150° C. or lower.

The thickness of the fourth capping layer PS4 may be between approximately 100 Å and 1,200 Å. The thickness of the fourth capping layer PS4 is related to the lyophilic function and the light transmittance. For example, if the thickness of the fourth capping layer PS4 is approximately 200 Å or more, the fourth capping layer PS4 can stably have the lyophilic function with the filler 70 as described above. For example, the effective thickness of the fourth capping layer PS4 having the lyophilic function with the filler 70 may be approximately 200 Å. In addition, if the thickness of the fourth capping layer PS4 is approximately 1,000 Å or less, the light transmittance of the fourth capping layer PS4 may be approximately 80% or higher. For example, in order to achieve the light transmittance of 80% or higher, the thickness of the fourth capping layer PS4 may be approximately 1,000 Å or less. In terms of the lyophilic function and light transmittance, the thickness of the fourth capping layer PS4 may, for example, be in a range of approximately 200 to 1,000 Å.

The fourth capping layer PS4 is a lyophilic inorganic layer in contact with the filler 70, which has a high surface tension, so that the dispersion and wetting properties of the filler 70 can be improved.

The above-described lyophilic inorganic layer (for example, the fourth capping layer) may be applied not only to the outermost portion of the second substrate 30 but also to the outermost portion of the first substrate 10. According to the exemplary embodiment shown in FIG. 19, a fifth capping layer PS5, which is a lyophilic inorganic layer, is further on the outermost portion of the first substrate 10.

Figure 19:
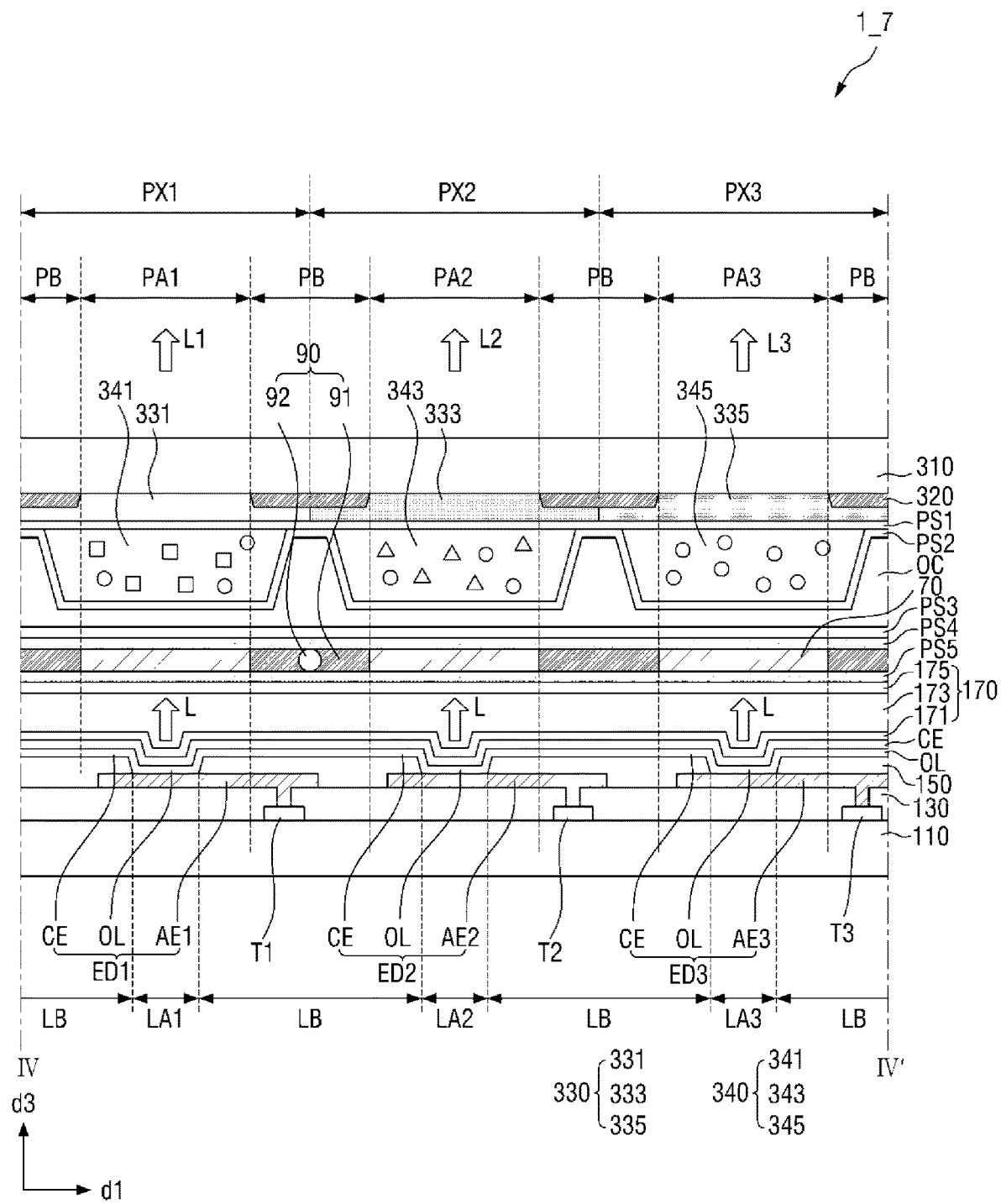

Referring to FIG. 19, the fourth capping layer PS4 may be on the outermost portion of the second substrate 30, and the fifth capping layer PS5 may be further between the second inorganic encapsulation layer 175 and the filler 70, which is the outermost portion of the first substrate 10. The fifth capping layer PS5 may include an oxide-rich metal oxide or non-metal oxide, like the above-described fourth capping layer PS4. The fifth capping layer PS5 may include metal or non-metal center atoms and oxide and nitrogen atoms that form covalent bonding with the center atom. In the fifth capping layer PS5, the content of oxygen may be greater than the content of nitrogen. The fifth capping layer PS5 is substantially identical to the fourth capping layer PS4; and, therefore, redundant description thereof will not be repeated here.

The fifth capping layer PS5 is a lyophilic inorganic layer in contact with the filler 70, which has a high surface tension, so that the dispersion and wetting properties of the filler 70 can be improved.

Figure 20:
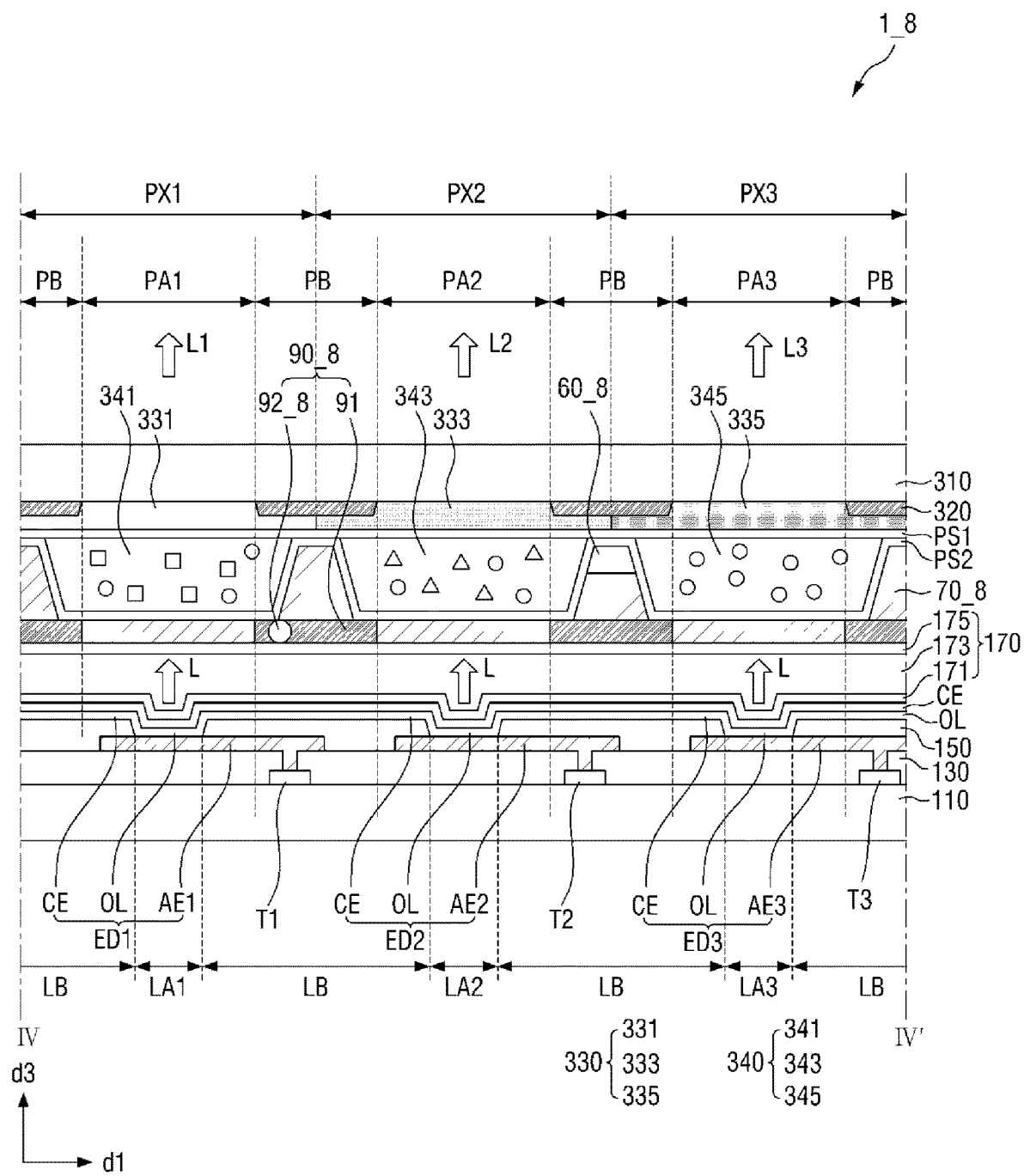
Figure 21:
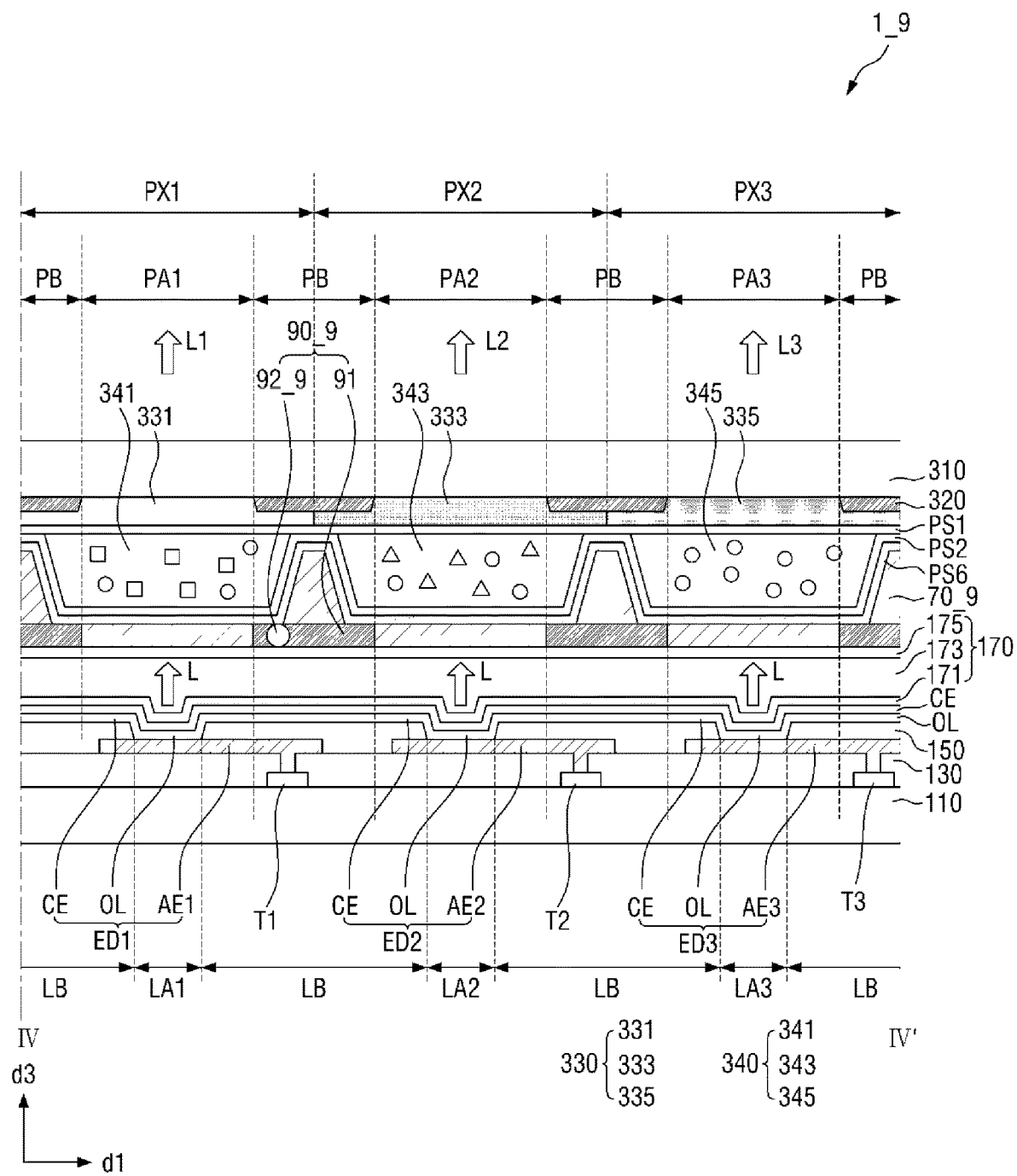
Figure 22:
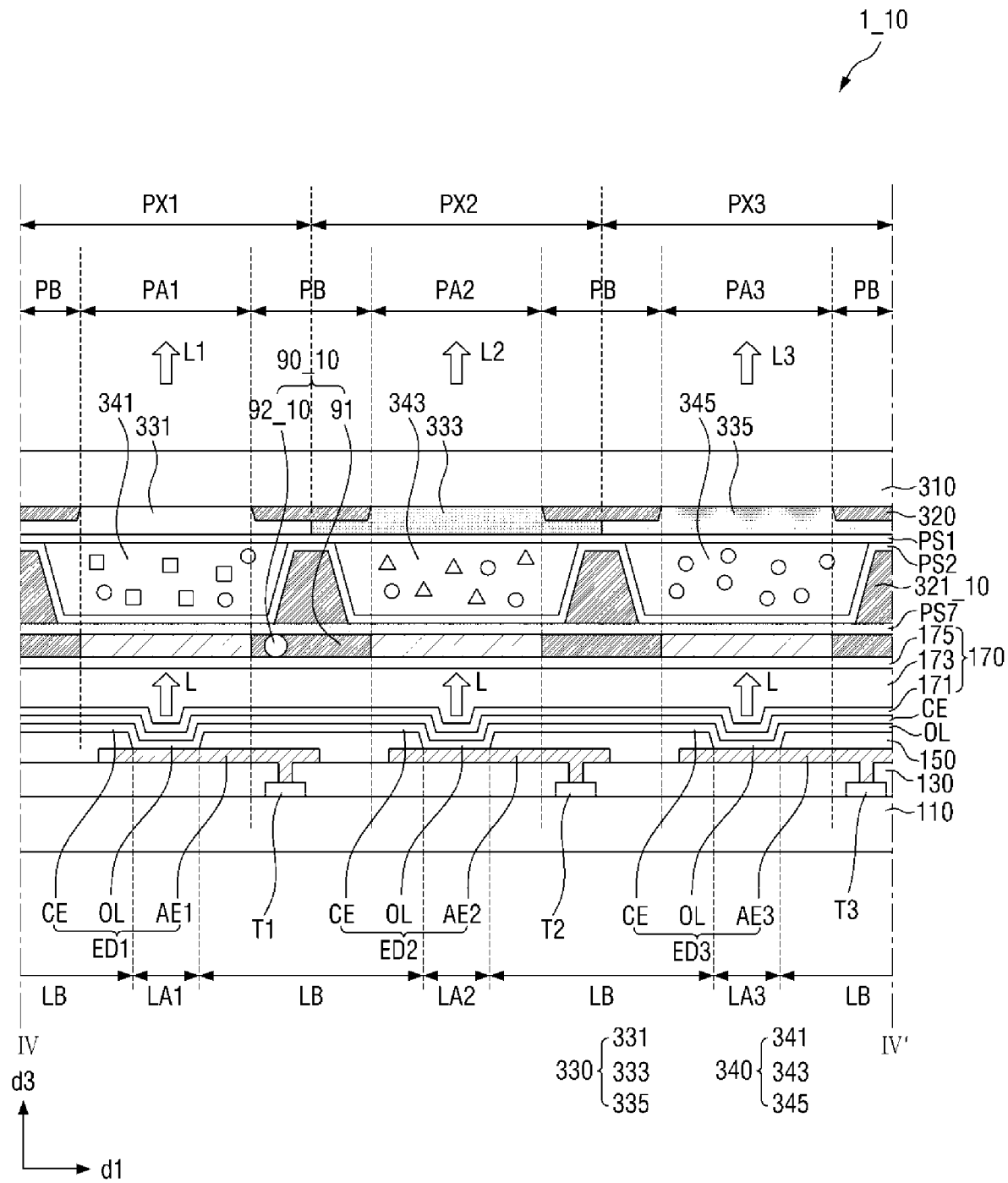

The exemplary embodiment of FIGS. 20 to 22 is substantially identical to the exemplary embodiment of FIG. 4 except that the former includes no planarization layer OC; and, therefore, the redundant description will be omitted.

Referring to FIG. 20, unlike the second substrate 30 shown in FIG. 4, the second substrate 30 includes neither planarization layer OC nor third capping layer PS3, but may include the filler 70 used for filling the entire space between the first substrate 10 and the second substrate 30.

A light-blocking/supporting member 90_8 may be between the first substrate 10 and the second substrate 30 and may be in contact with the first substrate 10. In an exemplary embodiment, at least a part of the light-blocking/supporting member 90_8 may be in contact with the second capping layer PS2 of the second substrate 30. In another exemplary embodiment, when the filler 70 between the first substrate 10 and the second substrate 30 is thick, the light-blocking/supporting member 90_8 may not be in contact with the second substrate 30.

The space surrounded by the second capping layer PS2 and the light-blocking/supporting member 90_8 in the cross section, that is, the space between the first wavelength conversion pattern 341, the second wavelength conversion pattern 343, and the light transmission pattern 345 may be filled with the filler 70. It is, however, to be understood that the present disclosure is not limited thereto. An air layer 60_8 may be formed between the second capping layer PS2 and the filler 70 depending on the adhesion between the second capping layer PS2 and the filler 70 and depending on how the space is filled. For example, some region or regions may not be filled.

According to the exemplary embodiment shown in FIG. 21, a sixth capping layer PS6 may be further on the second substrate 30 in order to improve the dispersion and wetting properties of the filler 70.

Referring to FIG. 21, the sixth capping layer PS6 may be further between the second capping layer PS2 of the second substrate 30, which is the outermost portion, and the filler 70. The sixth layer PS6 may include an oxide-rich metal oxide or non-metal oxide, like the fourth capping layer PS4 described above with reference to FIG. 18. The sixth capping layer PS6 may include metal or non-metal center atoms and oxide and nitrogen atoms that form covalent bonding with the center atom. In the sixth capping layer PS6, the content of oxygen may be greater than the content of nitrogen. The sixth capping layer PS6 is substantially identical to the fourth capping layer PS4; and, therefore, the redundant description will be omitted.

According to the exemplary embodiment of FIG. 22, a second light-blocking member 321_10 and a seventh capping layer PS7 are further on the second capping layer PS2.

Referring to FIG. 22, the second light-blocking member 321_10 used for filling a space between the light modulation patterns 340 of the second substrate 30 is included, and the seventh capping layer PS7 covering the second light-blocking member 321_10 is included.

The second light-blocking member 321_10 may be formed of an organic material containing at least one of graphite, carbon black, black pigment and black dye, or may be formed of a metal material including chromium (Cr). It is, however, to be noted that the material of the light-blocking member 320 is not particularly limited herein as long as it can block light transmission and absorb the light.

The seventh capping layer PS7 is made of an inorganic material and can prevent or reduce permeation of impurities such as moisture and air from the outside to damage the second light-blocking member 321_10.

In addition, the seventh capping layer PS7 may include an oxide-rich metal oxide or non-metal oxide, so that the adhesion with the filler 70 can be improved.

According to the exemplary embodiment of FIG. 22, the second light-blocking member 321_10 having light-blocking properties is between the light modulation patterns 340 instead of the planarization layer having the light transmittance, so that the overall height of the second substrate 30 can be made uniform (e.g., substantially uniform). Further, the second light-blocking member 321_10 can block the light exiting to the side portion of the light modulation patterns 340, thereby more effectively preventing or reducing color mixing among the first light-exiting area PA1, the second light-exiting area PA2, and the third light-exiting area PA2.

Like the above-described exemplary embodiments, when no planarization layer is on the second substrate 30, it is possible to reduce the thickness of the display device. In addition, the distance between the light-emitting elements ED and the light modulation patterns 340 is further reduced, so that the color gamut and the light extraction efficiency of the display device can be improved.

Figure 23:
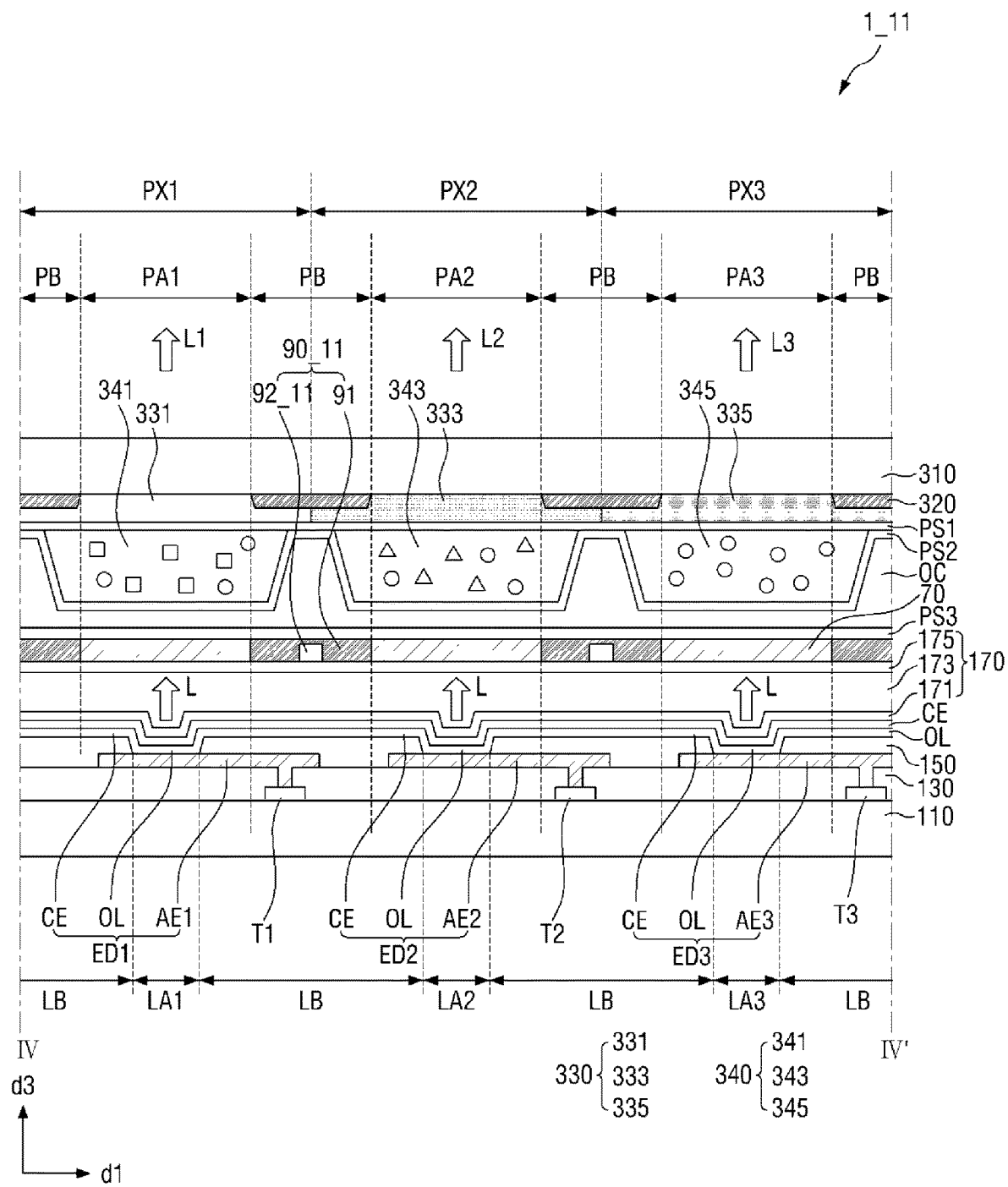

The exemplary embodiment of FIG. 23 is substantially identical to the exemplary embodiment of FIG. 4 except that a supporting portion 92_11 of a light-blocking/supporting member 90_11 is formed in direct contact with the first substrate 10 and has a cylindrical shape; and, therefore, the redundant description will be omitted. In addition, the structure may be identical to the structure shown in FIG. 3 when viewed from the top. Accordingly, the description will focus on differences.

A light-blocking/supporting member 90_11 may be between the first substrate 10 and the second substrate 30. The light-blocking/supporting member 90_11 may include a light-blocking portion 91 and a supporting portion 92_11 to maintain the gap between the first substrate 10 and the second substrate 30 and to prevent or reduce light leakage to an undesirable light-exiting area.

The supporting portion 92_11 of the light-blocking/supporting member 90_11 may be formed and then the light-blocking portion 91 may be formed. The supporting portion 92_11 may be formed in such a manner that a base material is formed on the entire surface of the first substrate 10, and then it may be subjected to a photolithography process such that it does not overlap with the first light-exiting area PA1, the second light-exiting area PA2, and the third light-exiting area PA3. The supporting portion 92_11 may be, but is not limited to being, formed in a cylindrical shape, which has a circular shape when viewed from the top and a quadrangular shape in cross section. The light-blocking portion 91 may be formed along the boundary of the first pixels PX1, the second pixels PX2, and the third pixels PX3 after forming the supporting portion 92_11. The light-blocking portion 91 may be located to cover the supporting portion 92_11 entirely and may cover the upper surface of the supporting portion 92_11. For example, the supporting portion 92_11 may not be in direct contact with the second substrate 30. It is, however, to be understood that the present disclosure is not limited thereto. The height of the supporting portion 92_11 may be substantially identical to the height of the light-blocking portion 91, so that the supporting portion 92_11 may be in contact with the second substrate 30.

According to the exemplary embodiment of FIG. 23, the supporting portion 92_11 is formed via a photolithography process. By doing so, the supporting portion 92_11 can be formed at a desired position on the first substrate 10, and an appropriate number of supporting portions 92_11 can be formed.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, acts, operations, elements, and/or components, but do not preclude the presence or addition of one or more other features, integers, acts, operations, elements, components, and/or groups thereof. Expressions such as "at least one of," when preceding a list of elements, modify the entire list of elements and do not modify the individual elements of the list.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

In concluding the present description, those skilled in the art will appreciate that many variations and modifications can be made to the disclosed embodiments without substantially departing from the principles of the present disclosure. Therefore, the disclosed embodiments of the present disclosure are used in a generic and descriptive sense only and not for purposes of limitation.

What is claimed is:

1. A display device comprising:
   a first substrate;
   a plurality of light-emitting elements on the first substrate;
   an encapsulation layer on the plurality of light-emitting elements;
   a filler layer on the encapsulation layer;
   a plurality of wavelength conversion patterns on the filler layer and overlapping the plurality of light-emitting elements; and
   a plurality of color filters on the wavelength conversion patterns, and a first light-blocking member between adjacent ones of the plurality of color filters,
   wherein the filler layer comprises a supporting member overlapping the first light-blocking member in a thickness direction.

2. The display device of claim 1, wherein the supporting member comprises an acrylic based organic material.

3. The display device of claim 1, wherein the filler layer further comprises a light blocking portion overlapping the first light-blocking member, and a filler between the light blocking portion, and
   wherein the supporting member is on the light blocking portion.

4. The display device of claim 3, wherein a diameter of the supporting member is the same as or smaller than a diameter of the light blocking portion.

5. The display device of claim 3, wherein the supporting member comprises a plurality of supporting members in the light blocking portion.

6. The display device of claim 3, wherein a width of the light blocking portion is the same as or greater than a width of the first light-blocking member.

7. The display device of claim 1, wherein at least one of the plurality of color filters is on one surface of the first light-blocking member, and
   a portion of the color filter on the first light-blocking member overlaps the supporting member.

8. The display device of claim 3, further comprising: a capping layer on a surface of the wavelength conversion patterns which is opposing the first substrate, and
   wherein at least portion of the capping layer contacts the light blocking portion.

9. The display device of claim 1, further comprising: a second light-blocking member between the supporting member and the first light-blocking member, and
   wherein the plurality of wavelength conversion patterns is between the second light-blocking member.

10. The display device of claim 3, wherein the encapsulating layer comprises a first inorganic encapsulation layer on the light-emitting elements, an organic encapsulation layer on the first inorganic encapsulation layer, and a second inorganic encapsulation layer on the organic encapsulation layer, and
    wherein at least portion of the second inorganic encapsulation layer contacts the light blocking portion.

11. The display device of claim 1, wherein each of the plurality of light-emitting elements comprises a first electrode on the first substrate, an organic light-emitting layer on the first electrode, and a second electrode on the organic-emitting layer, and
    wherein at least a portion of the organic light-emitting layer overlaps the supporting member.

12. The display device of claim 11, wherein the second electrode overlaps the first light-blocking member and the plurality of color filters.

13. The display device of claim 11, further comprising: a bank layer on the first electrode and overlapping the supporting member.

14. The display device of claim 1, wherein each of the plurality of light-emitting elements comprises a first electrode, a second electrode spaced apart from the first electrode, and a light-emitting layer between the first electrode and the second electrode.

15. A display device comprising:
    a first substrate comprising first areas spaced apart from each other in a first direction and a second direction, and a second area between adjacent ones of the first areas;
    a plurality of light-emitting elements on the first substrate and at the first area;
    an encapsulation layer on the plurality of light-emitting elements;
    a filler layer on the encapsulation layer comprising a filler on the first area and a plurality of supporting members on the second area;
    a plurality of wavelength conversion patterns on the filler layer and the first area;
    a plurality of color filters on the plurality of wavelength conversion patterns and the first area; and
    a first light-blocking member between adjacent ones of the plurality of color filters and on the second area.

16. The display device of claim 15, wherein the filler layer further comprises a light-blocking portion on the second area, and
    wherein the plurality of supporting members are in the light-blocking portion.

17. The display device of claim 15, wherein at least one of the plurality of supporting members does not overlap the first area in the first direction and the second direction.

18. The display device of claim 15, wherein at least a portion of the plurality of color filters is on the second area, and wherein a portion of the plurality of color filters that is on the second area overlaps the first light-blocking member and the plurality of supporting members.

19. The display device of claim 15, wherein further comprising: a second light-blocking member on the second area; and wherein the plurality of wavelength conversion patterns are between the second light-blocking member.

20. The display device of claim 15, wherein each of the plurality of light-emitting elements comprises a first electrode on the first substrate, an organic-emitting layer on the first electrode, and a second electrode on the organic-emitting layer, and wherein at least a portion of the organic-emitting layer is on the second area.

\* \* \* \* \*